(12) United States Patent
Eun et al.

(10) Patent No.: US 10,971,548 B2
(45) Date of Patent: Apr. 6, 2021

(54) VARIABLE RESISTANCE MEMORY DEVICE INCLUDING SYMMETRICAL MEMORY CELL ARRANGEMENTS AND METHOD OF FORMING THE SAME

(71) Applicant: SAMSUNG ELECTRONICS CO., LTD., Suwon-si (KR)

(72) Inventors: Sung-Ho Eun, Seoul (KR); Daehwan Kang, Seoul (KR); Sungwon Kim, Hwaseong-si (KR); Youngbae Kim, Seoul (KR); Seokjae Won, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/354,545

(22) Filed: Mar. 15, 2019

(65) Prior Publication Data

US 2020/0027925 A1    Jan. 23, 2020

(30) Foreign Application Priority Data

Jul. 17, 2018  (KR) .......................... 10-2018-0082678

(51) Int. Cl.
*H01L 27/24*    (2006.01)
*H01L 45/00*    (2006.01)

(52) U.S. Cl.
CPC ........ *H01L 27/2481* (2013.01); *H01L 27/249* (2013.01); *H01L 27/2463* (2013.01);
(Continued)

(58) Field of Classification Search
None
See application file for complete search history.

(56) References Cited

U.S. PATENT DOCUMENTS 8,664,633 B2    3/2014  Park et al.
8,963,115 B2 *  2/2015  Murooka .............. H01L 27/249
(Continued)

*Primary Examiner* — Andres Munoz
(74) *Attorney, Agent, or Firm* — Sughrue Mion, PLLC

(57) ABSTRACT

A variable resistance non-volatile memory device can include a semiconductor substrate and a plurality of first conductive lines each extending in a first direction perpendicular to the semiconductor substrate and spaced apart in a second direction on the semiconductor substrate. A second conductive line can extend in the second direction parallel to the semiconductor substrate on a first side of the plurality of first conductive lines and a third conductive line can extend in the second direction parallel to the semiconductor substrate on a second side of the plurality of first conductive lines opposite the first side of the plurality of first conductive lines. A plurality of first non-volatile memory cells can be on the first side of the plurality of first conductive lines and each can be coupled to the second conductive line and to a respective one of the plurality of first conductive lines, where each of the plurality of first non-volatile memory cells can include a switching element, a variable resistance element, and an electrode arranged in a first sequence. A plurality of second non-volatile memory cells can be on the second side of the plurality of first conductive lines and each can be coupled to the third conductive line and to a respective one of the plurality of first conductive lines, wherein each of the plurality of second non-volatile memory cells includes a switching element, a variable resistance element, and an electrode that are arranged in a second sequence, wherein the first sequence and the second sequence are symmetrical with one another about the plurality of first conductive lines.

32 Claims, 37 Drawing Sheets

(52) U.S. Cl.
CPC .......... *H01L 45/06* (2013.01); *H01L 45/1226* (2013.01); *H01L 45/1253* (2013.01); *H01L 45/141* (2013.01); *H01L 45/1608* (2013.01); *H01L 45/1683* (2013.01)

(56) References Cited

U.S. PATENT DOCUMENTS

| | | | |
|---|---|---|---|
| 9,099,648 B2 * | 8/2015 | Yamato | H01L 45/1233 |
| 9,252,362 B2 | 2/2016 | Pio | |
| 9,444,046 B2 | 9/2016 | Pio | |
| 9,640,588 B2 * | 5/2017 | Sciarrillo | H01L 45/06 |
| 9,728,584 B2 | 8/2017 | Ramaswamy et al. | |
| 2008/0265235 A1 * | 10/2008 | Kamigaichi | H01L 27/2409 |
| | | | 257/2 |
| 2012/0147649 A1 * | 6/2012 | Samachisa | H01L 27/11551 |
| | | | 365/51 |
| 2017/0117328 A1 * | 4/2017 | Terai | H01L 27/2481 |
| 2017/0294447 A1 | 10/2017 | Lee et al. | |
| 2018/0047787 A1 | 2/2018 | Nakamura et al. | |

* cited by examiner

FIG. 7C
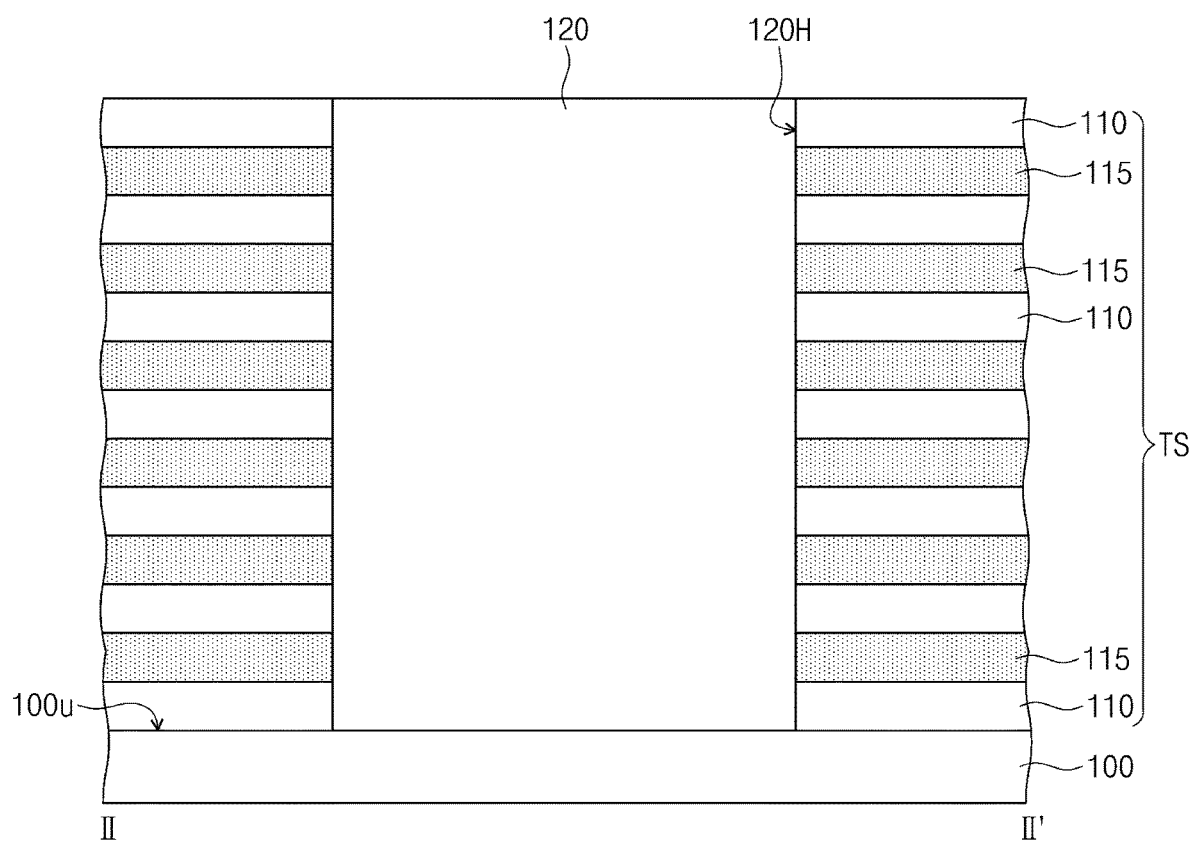
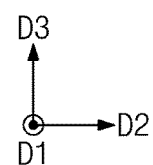

FIG. 8B
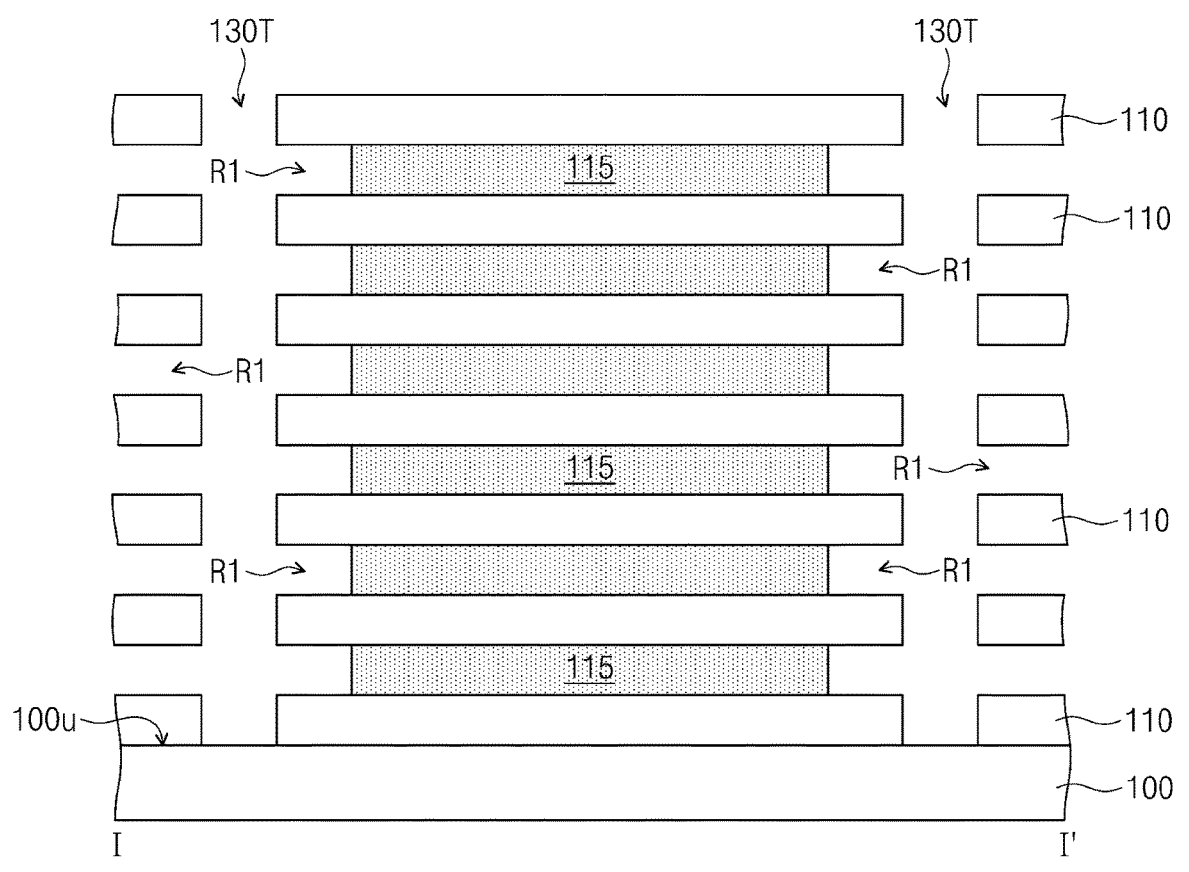
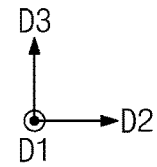

FIG. 8C
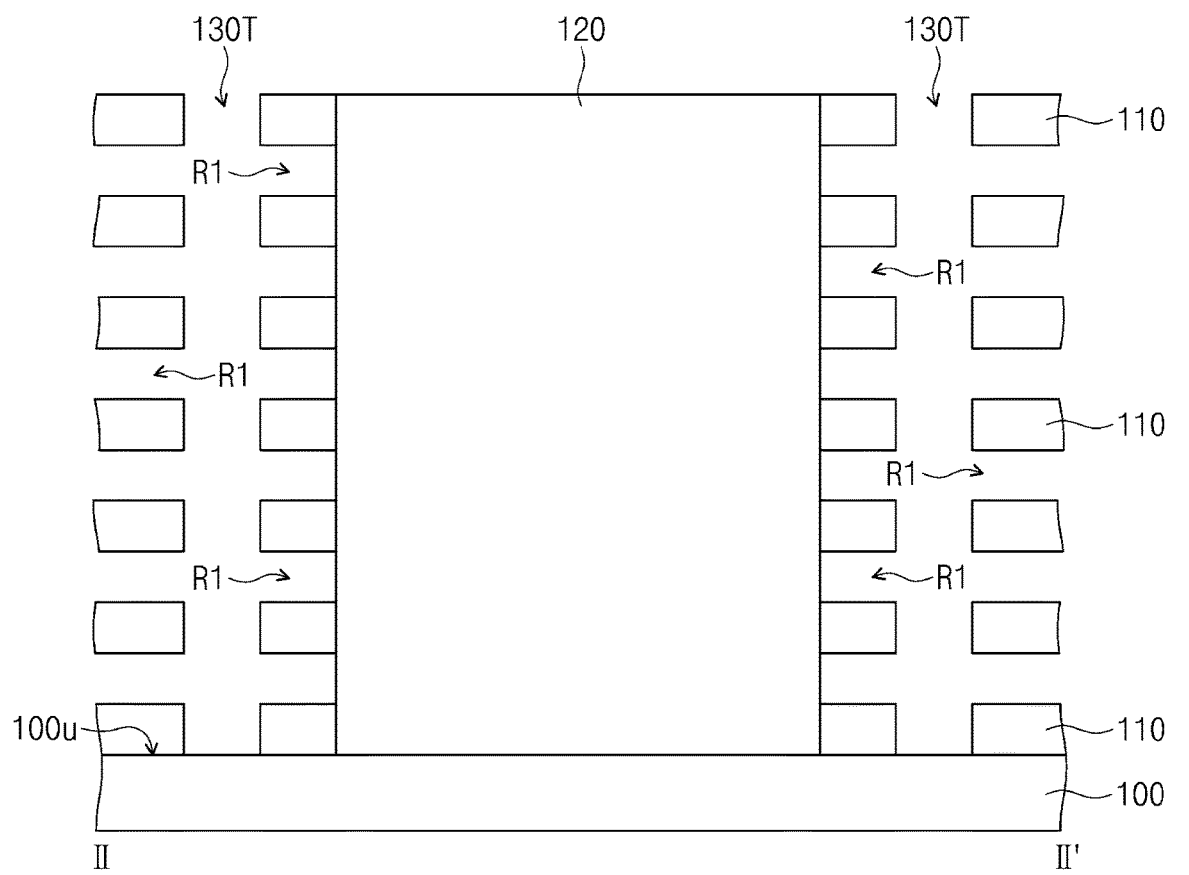
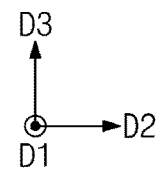

FIG. 10C
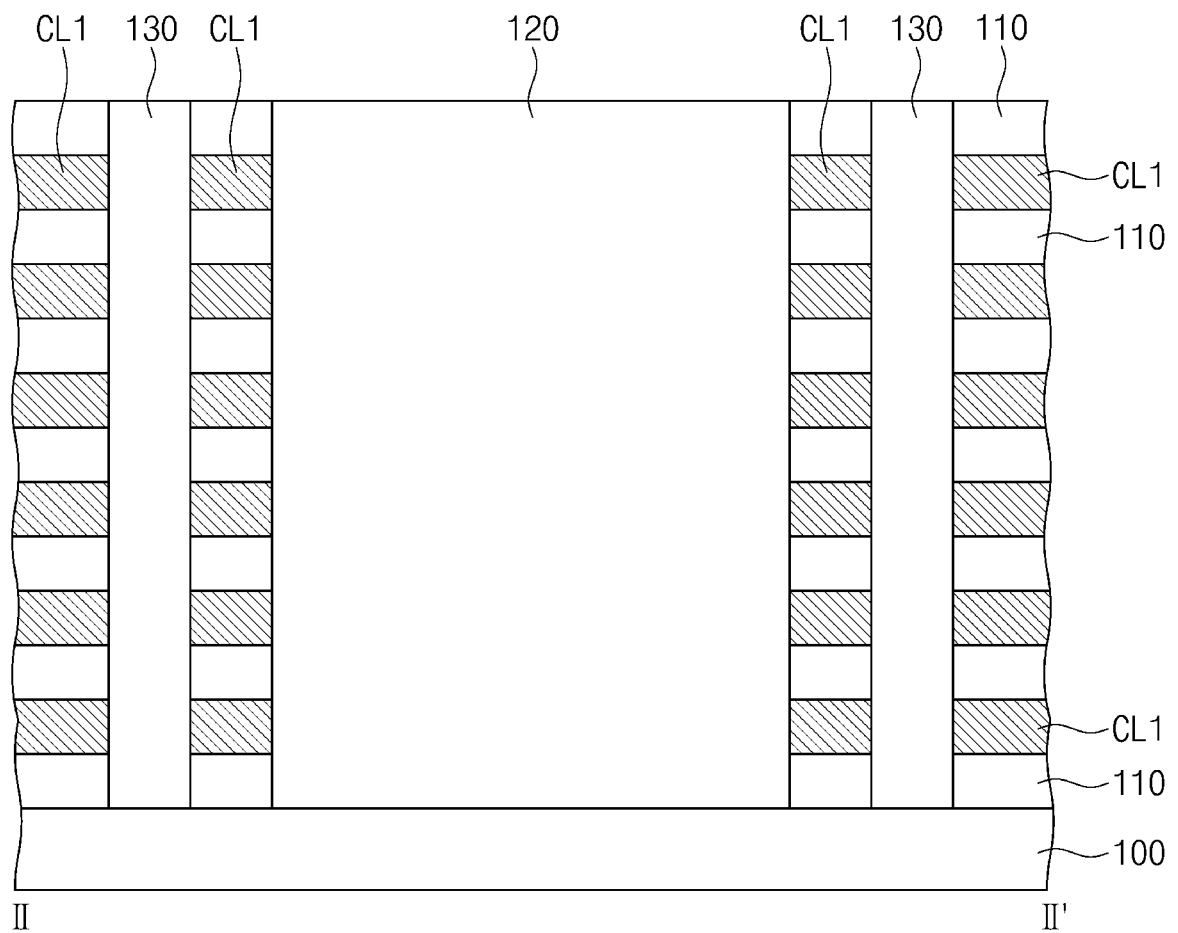
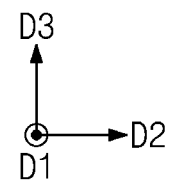

FIG. 11B
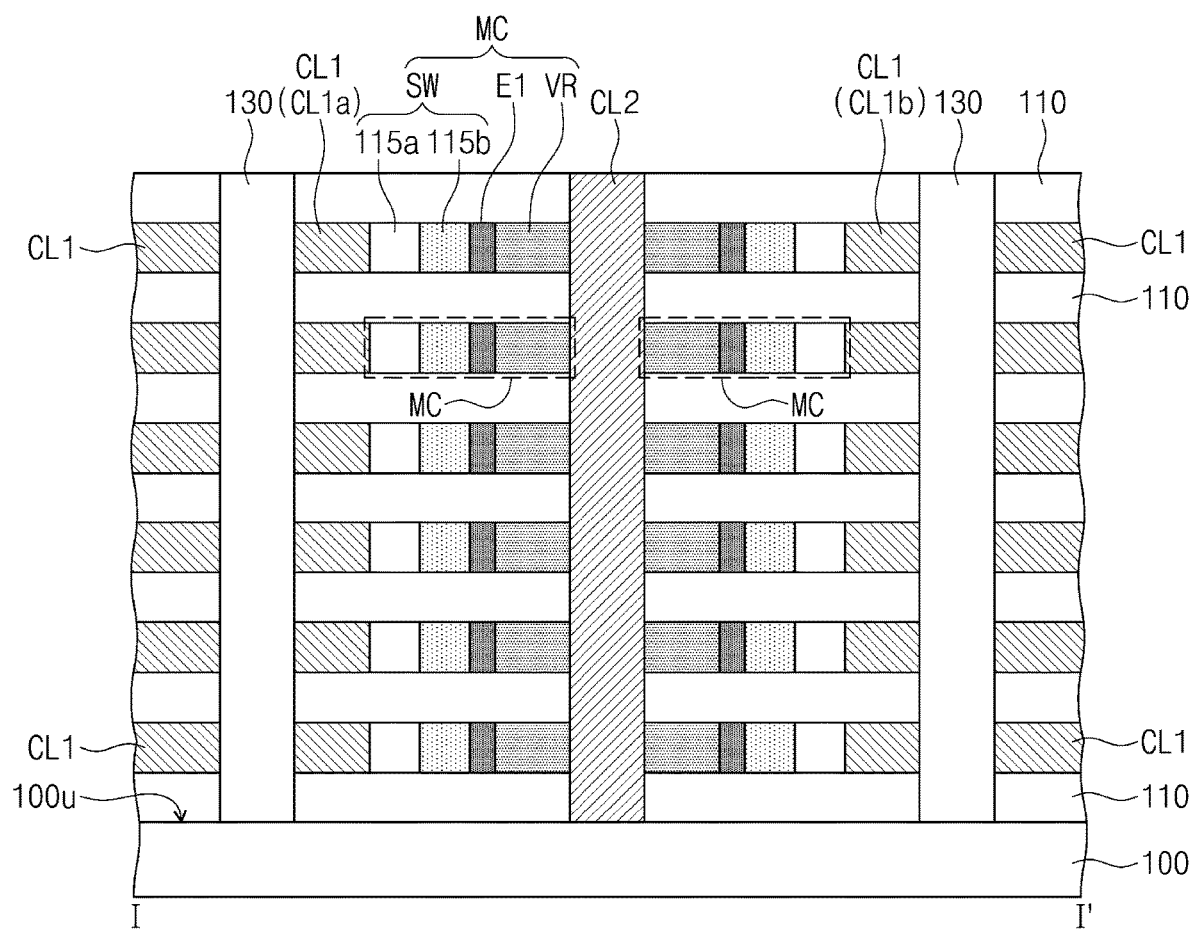
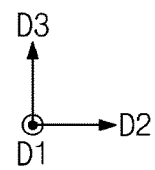

FIG. 11C
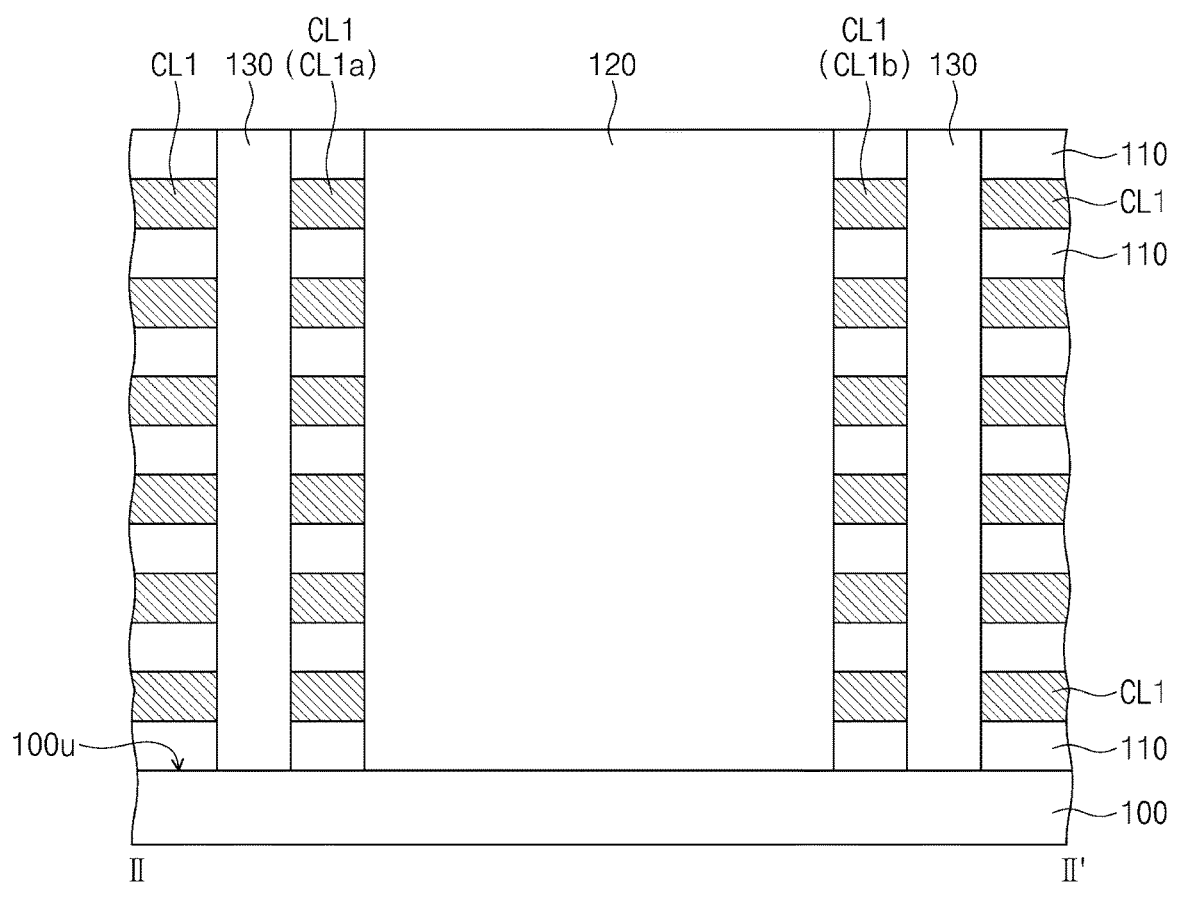
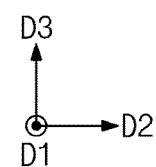

FIG. 21
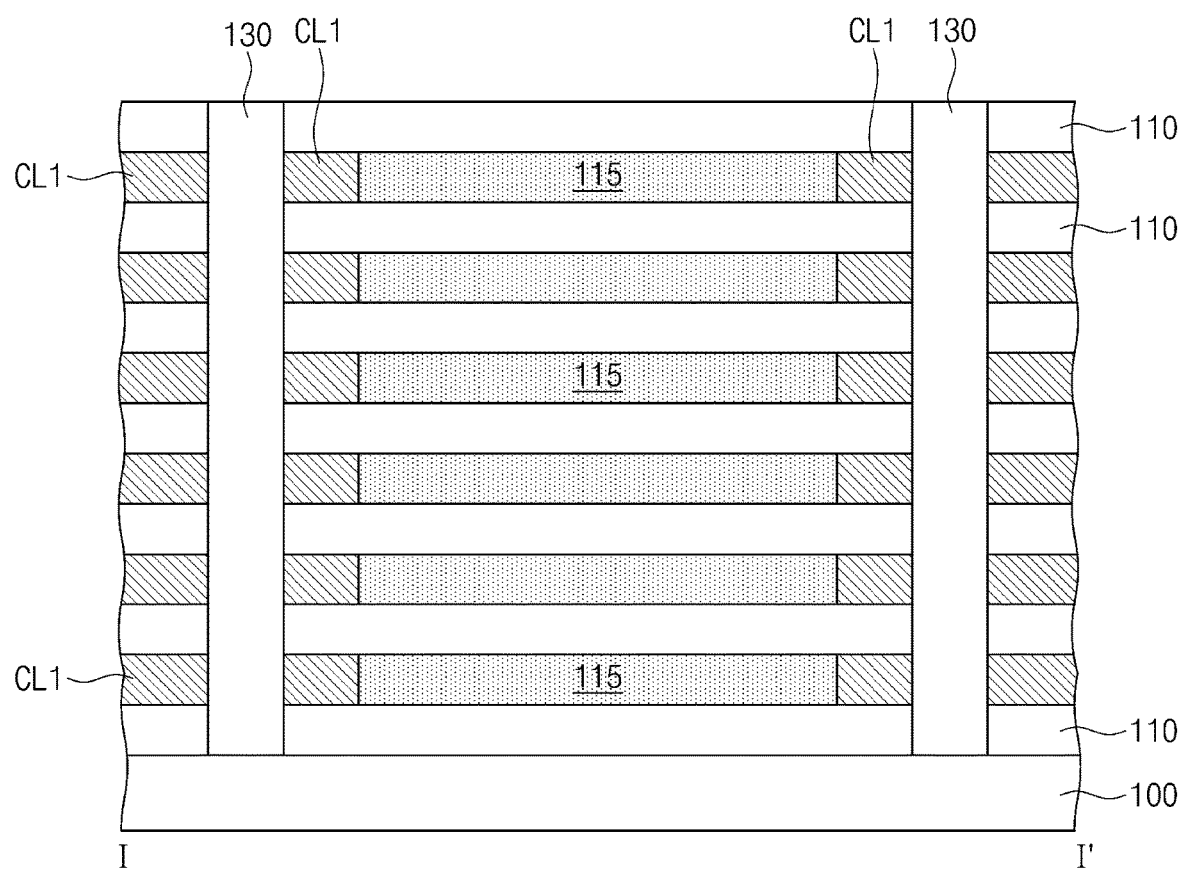
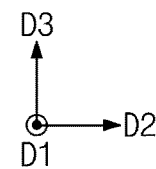

VARIABLE RESISTANCE MEMORY DEVICE INCLUDING SYMMETRICAL MEMORY CELL ARRANGEMENTS AND METHOD OF FORMING THE SAME

CROSS-REFERENCE TO THE RELATED APPLICATION

This application claims priority from Korean Patent Application No. 10-2018-0082678 filed on Jul. 17, 2018 in the Korean Intellectual Property Office, the disclosure of which is hereby incorporated by reference in its entirety.

BACKGROUND

Embodiments of the inventive concepts relate to a variable resistance memory device and, more particularly, to a variable resistance memory device including three-dimensionally arranged memory cells.

Semiconductor devices have been highly integrated to provide excellent performance and low manufacture costs. The integration density of semiconductor devices directly affects the costs of the semiconductor devices, thereby resulting in a demand of highly integrated semiconductor devices. The integration density of typical two-dimensional (2D) or planar semiconductor devices may be mainly determined by an area where a unit memory cell occupies. Therefore, the integration density of the typical 2D or planar semiconductor devices may be greatly affected by a technique of forming fine patterns. However, since extremely high-priced apparatuses may be needed to form fine patterns, the integration density of 2D semiconductor devices continues to increase but may still be limited. Three-dimensional (3D) semiconductor devices including three-dimensionally arranged memory cells have been developed to overcome these limitations. In addition, next-generation semiconductor memory devices (e.g., magnetic random access memory (MRAM) devices and phase-change random access memory (PRAM) devices) have been developed to provide high-performance and low power consumption semiconductor memory devices.

SUMMARY

Embodiments of the inventive concepts may provide a variable resistance memory device capable of increasing an integration density and a method of manufacturing the same. Pursuant to these embodiments, a variable resistance non-volatile memory device can include a semiconductor substrate and a plurality of first conductive lines each extending in a first direction perpendicular to the semiconductor substrate and spaced apart in a second direction on the semiconductor substrate. A second conductive line can extend in the second direction parallel to the semiconductor substrate on a first side of the plurality of first conductive lines and a third conductive line can extend in the second direction parallel to the semiconductor substrate on a second side of the plurality of first conductive lines opposite the first side of the plurality of first conductive lines. A plurality of first non-volatile memory cells can be on the first side of the plurality of first conductive lines and each can be coupled to the second conductive line and to a respective one of the plurality of first conductive lines, where each of the plurality of first non-volatile memory cells can include a switching element, a variable resistance element, and an electrode arranged in a first sequence. A plurality of second non-volatile memory cells can be on the second side of the plurality of first conductive lines and each can be coupled to the third conductive line and to a respective one of the plurality of first conductive lines, wherein each of the plurality of second non-volatile memory cells includes a switching element, a variable resistance element, and an electrode that are arranged in a second sequence, wherein the first sequence and the second sequence are symmetrical with one another about the plurality of first conductive lines.

In some embodiments, a variable resistance non-volatile memory device can include a semiconductor substrate. A first conductive line can extend in a first direction perpendicular to the semiconductor substrate and a plurality of second conductive lines can be vertically stacked on one another, where each of the second conductive lines can extend in a second direction parallel to the semiconductor substrate on a first side of the first conductive line. A plurality of third conductive lines can be vertically stacked on one another, where each of the third conductive lines can extend in the second direction parallel to the semiconductor substrate on a second side of the first conductive line opposite the first side of the first conductive line. A plurality of insulating layers, wherein each of the plurality of insulating layers can separate vertically adjacent ones of the plurality of second conductive lines from one another and can separate vertically adjacent ones of the plurality of third conductive lines from one another. A plurality of variable resistance elements can be simultaneously formed between the plurality of insulating layers to couple to respective ones of the plurality second conductive lines and to respective ones of the plurality of third conductive lines.

In some embodiments, a method of forming a variable resistance non-volatile memory device, can include forming a structure including alternating insulating layers and sacrificial layers on a substrate, forming a plurality of filling insulating layers extending vertically through the structure spaced apart on the substrate, forming a first trench through the structure to provide first recessed sidewalls of each of the sacrificial layers through which the first trench passes, forming a second trench through the structure, spaced apart from the first trench, to provide second recessed sidewalls of each of the sacrificial layers, opposite the first recessed sidewalls, forming a first phase change memory cell portion on each of the first recessed sidewalls, forming a second phase change memory cell portion on each of the second recessed sidewalls, forming first conductive lines on the first phase change memory cell portion and on the second phase change memory cell portion, forming an isolation insulation pattern in the first trench and in the second trench, forming a third trench through the structure between first trench and the second trench to expose the first phase change memory cell portion and to expose the second phase change memory cell portion, forming a third phase change memory cell portion on each first phase change memory cell portion through the third trench to provide first phase change memory cells, forming a fourth phase change memory cell portion on each second phase change memory cell portion through the third trench to provide second phase change memory cells and forming a second conductive line in the third trench on the first phase change memory cell and on the second phase change memory cell.

BRIEF DESCRIPTION OF THE DRAWINGS

FIGS. 7A to 11A are plan views illustrating a method of manufacturing a variable resistance memory device according to some embodiments of the inventive concepts.

FIGS. 7B to 11B are cross-sectional views taken along lines I-I' of FIGS. 7A to 11A, respectively.

FIGS. 7C to 11C are cross-sectional views taken along lines II-II' of FIGS. 7A to 11A, respectively.

FIGS. 21 and 22 are cross-sectional views illustrating a method of manufacturing a variable resistance memory device according to some embodiments of the inventive concepts.

DETAILED DESCRIPTION OF THE EMBODIMENTS

Hereinafter, embodiments of the inventive concepts will be described in detail with reference to the accompanying drawings.

Figure 1:
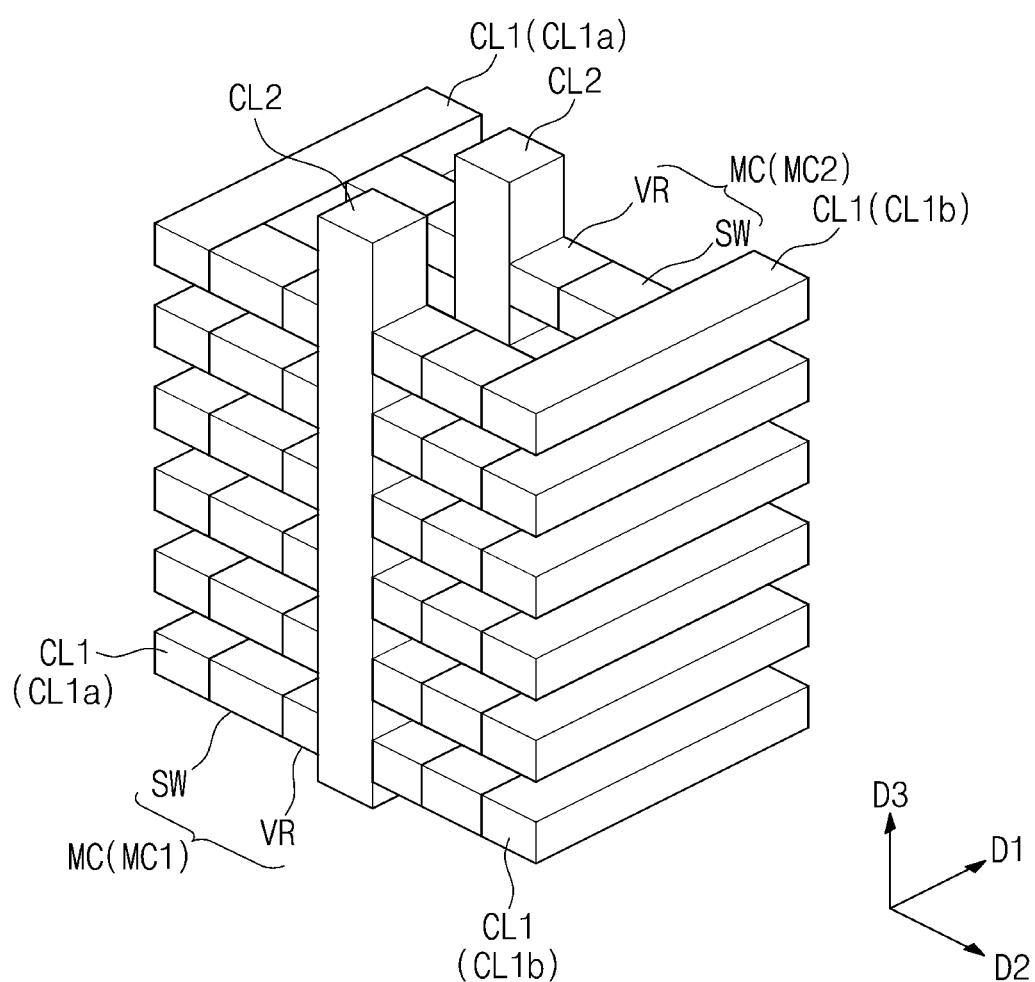
FIG. 1 is a perspective view schematically illustrating a variable resistance memory device according to some embodiments of the inventive concepts.

FIG. 1 is a perspective view schematically illustrating a variable resistance memory device according to some embodiments of the inventive concepts.

Referring to FIG. 1, first conductive lines CL1 and second conductive lines CL2 may be provided. Here, each of the first conductive lines CL1 may constitute a word line of the variable resistance memory device, and each of the second conductive lines CL1 may constitute a bit line of the variable resistance memory device. The second conductive lines CL2 may intersect the first conductive lines CL1. The first conductive lines CL1 may extend in a first direction D1. The first conductive lines CL1 may include first sub-conductive lines CL1a provided at one side of the second conductive lines CL2 and second sub-conductive lines CL1b provided at opposite side of the second conductive lines CL2. The second sub-conductive lines CL1b may be spaced apart from the first sub-conductive lines CL1a in a second direction D2 intersecting the first direction D1. The first sub-conductive lines CL1a maybe spaced apart from each other in a third direction D3 perpendicular to the first and second directions D1 and D2, and the second sub-conductive lines CL1b may also be spaced apart from each other in the third direction D3. The second conductive lines CL2 may be disposed between the first sub-conductive lines CL1a and the second sub-conductive lines CL1b. The second conductive lines CL2 may extend in the third direction D3 and may be spaced apart from each other in the first direction D1.

Memory cells MC may be provided at intersecting points of the first conductive lines CL1 and the second conductive lines CL2, respectively. The memory cells MC may include first memory cells MC1 provided at intersecting points of the first sub-conductive lines CL1a and the second conductive lines CL2, respectively, and second memory cells MC2 provided at intersecting points of the second sub-conductive lines CL1b and the second conductive lines CL2, respectively. The first memory cells MC1 may be disposed between the first sub-conductive lines CL1a and the second conductive lines CL2 and may be arranged to be spaced apart from each other in the first direction D1 and the third direction D3. Each of the first memory cells MC1 may be connected to a corresponding one of the first sub-conductive lines CL1a and a corresponding one of the second conductive lines CL2. The second memory cells MC2 may be disposed between the second sub-conductive lines CL1b and the second conductive lines CL2 and may be arranged to be spaced apart from each other in the first direction D1 and the third direction D3. Each of the second memory cells MC2 may be connected to a corresponding one of the second sub-conductive lines CL1b and a corresponding one of the second conductive lines CL2. The second memory cells MC2 may be spaced apart from the first memory cells MC1 in the second direction D2.

Each of the memory cells MC may include a variable resistance element VR and a selection element SW. The variable resistance element VR and the selection element SW may be horizontally arranged in the second direction D2. The variable resistance element VR and the selection element SW may be connected in series between a pair of conductive lines CL1 and CL2 connected thereto. For example, the variable resistance element VR and the selection element SW included in each of the first memory cells MC1 may be connected in series between the corresponding one of the first sub-conductive lines CL1a and the corresponding one of the second conductive lines CL2. The variable resistance element VR and the selection element SW included in each of the second memory cells MC2 may be connected in series between the corresponding one of the second sub-conductive lines CL1b and the corresponding one of the second conductive lines CL2.

Each of the first memory cells MC1 and each of the second memory cells MC2 may be symmetrical with respect to the corresponding one of the second conductive lines CL2. In some embodiments, the variable resistance element VR of each of the first memory cells MC1 and the variable resistance element VR of each of the second memory cells MC2 may be connected in common to the corresponding one of the second conductive lines CL2, and the selection element SW of each of the first memory cells MC1 and the selection element SW of each of the second memory cells MC2 may be connected to the corresponding one of the first sub-conductive lines CL1a and the corresponding one of the second sub-conductive lines CL1b, respectively. In certain embodiments, unlike FIG. 1, the selection element SW of each of the first memory cells MC1 and the selection element SW of each of the second memory cells MC2 may be connected in common to the corresponding one of the second conductive lines CL2, and the variable resistance element VR of each of the first memory cells MC1 and the variable resistance element VR of each of the second memory cells MC2 may be connected to the corresponding one of the first sub-conductive lines CL1a and the corresponding one of the second sub-conductive lines CL1b, respectively.

FIGS. 2A to 2D are perspective views respectively illustrating unit memory cells of variable resistance memory devices according to some embodiments of the inventive concepts.

Referring to FIGS. 2A to 2D, the memory cell MC may be provided between the first conductive line CL1 and the second conductive line CL2, which intersect each other. The memory cell MC may include the variable resistance element VR and the selection element SW, which are connected in series between the first and second conductive lines CL1 and CL2. The variable resistance element VR may include a material capable of storing information (or data) using its resistance change. For example, the variable resistance element VR may include a material of which a phase is reversibly changeable between a crystalline state and an amorphous state by a temperature. The selection element SW may be a diode or may be an element based on a threshold switching phenomenon having a nonlinear I-V curve (e.g., an S-shaped I-V curve). For example, the selection element SW may be an ovonic threshold switch (OTS) element having a bi-directional characteristic.

Figure 2A:
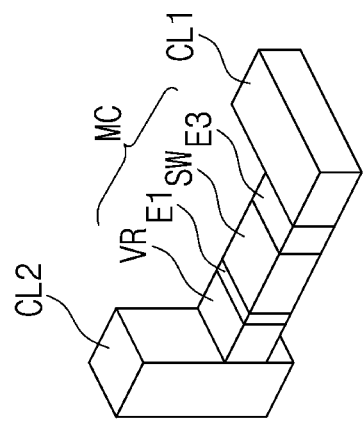
FIGS. 2A to 2D are perspective views respectively illustrating unit memory cells of variable resistance memory devices according to some embodiments of the inventive concepts.
Figure 2C:
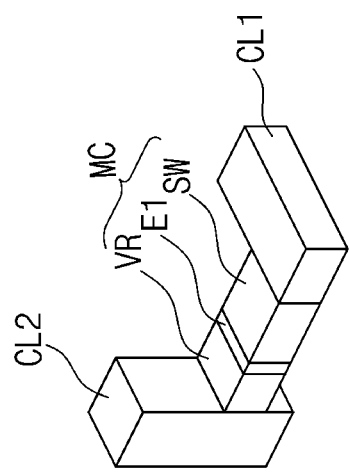
Figure 2B:
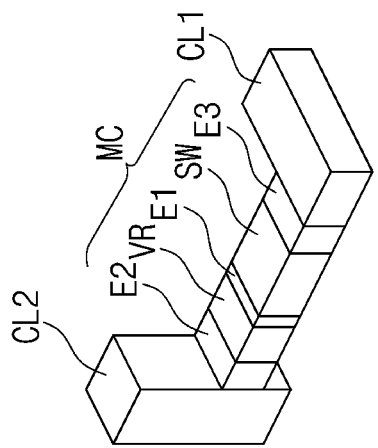
Figure 2D:
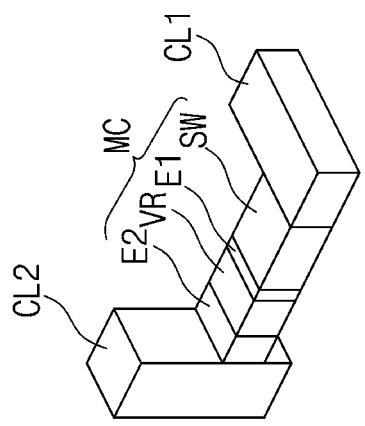

In some embodiments, as illustrated in FIG. 2A, the memory cell MC may further include a first electrode E1 disposed between the variable resistance element VR and the selection element SW. The first electrode E1 may electrically connect the variable resistance element VR and the selection element SW and may prevent the variable resistance element VR from being in direct contact with the selection element SW. In certain embodiments, as illustrated in FIG. 2B, the memory cell MC may further include the first electrode E1 disposed between the variable resistance element VR and the selection element SW, and a second electrode E2 disposed between the variable resistance element VR and the second conductive line CL2. The second electrode E2 may be spaced apart from the first electrode E1 with the variable resistance element VR interposed therebetween. The second electrode E2 may electrically connect the variable resistance element VR and the second conductive line CL2. In certain embodiments, as illustrated in FIG. 2C, the memory cell MC may further include the first electrode E1 disposed between the variable resistance element VR and the selection element SW, and a third electrode E3 disposed between the selection element SW and the first conductive line CL1. The third electrode E3 may be spaced apart from the first electrode E1 with the selection element SW interposed therebetween. The third electrode E3 may electrically connect the selection element SW and the first conductive line CL1. In certain embodiments, as illustrated in FIG. 2D, the memory cell MC may further include the first electrode E1 disposed between the variable resistance element VR and the selection element SW, the second electrode E2 disposed between the variable resistance element VR and the second conductive line CL2, and the third electrode E3 disposed between the selection element SW and the first conductive line CL1.

Figure 3:
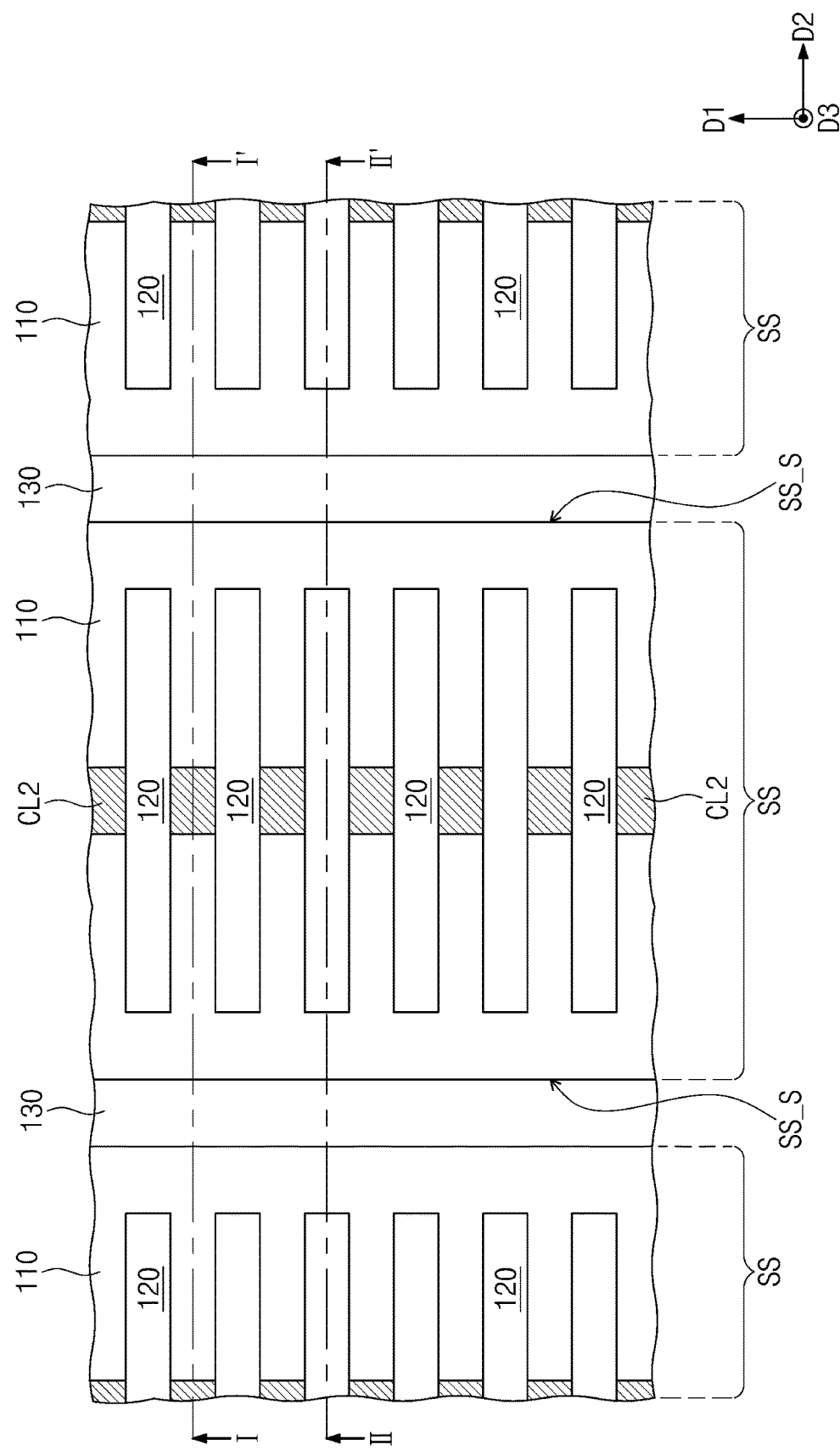
FIG. 3 is a plan view illustrating a variable resistance memory device according to some embodiments of the inventive concepts.
Figure 4:
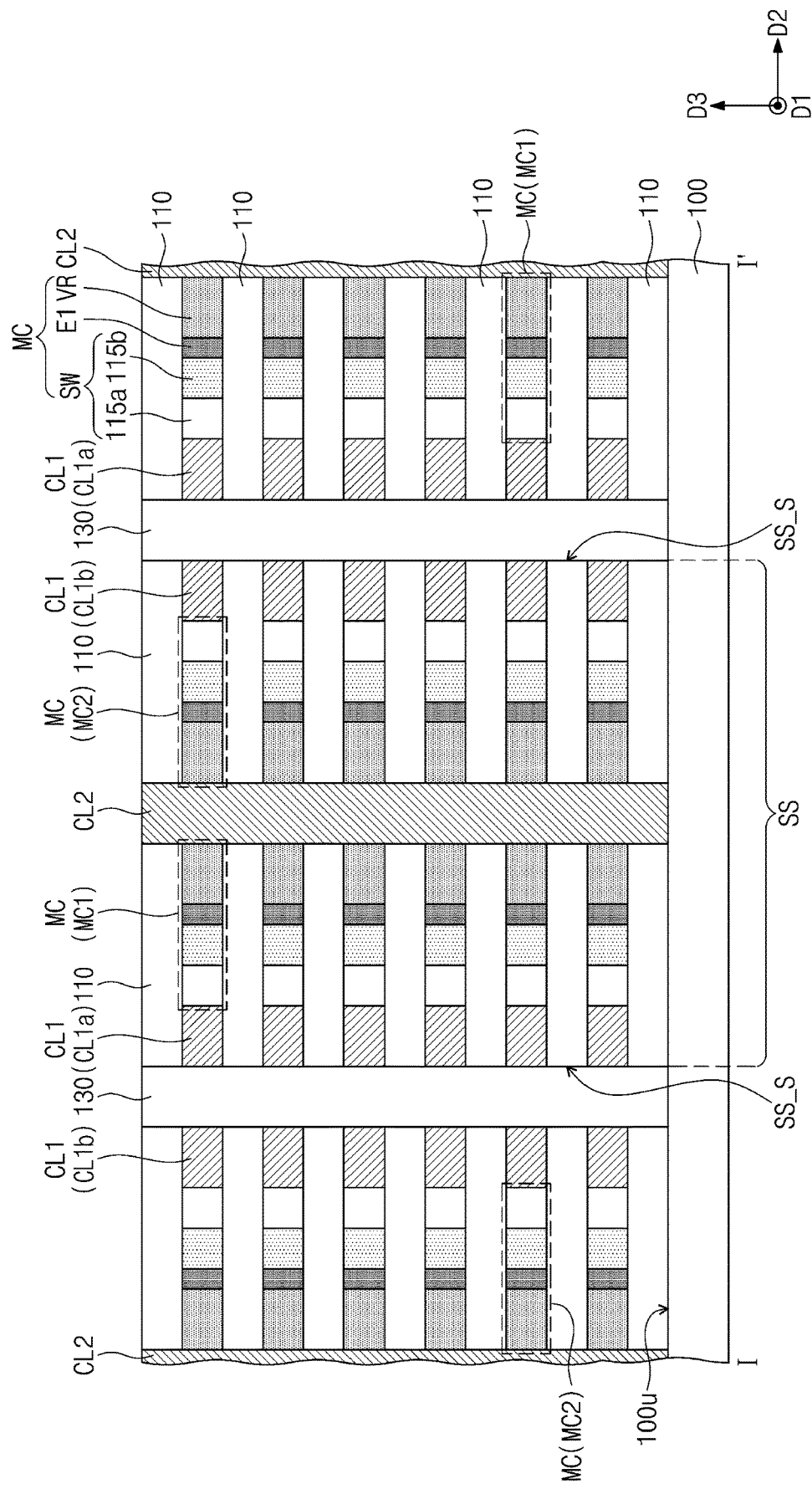
FIG. 4 is a cross-sectional view taken along a line I-I' of FIG. 3.
Figure 5:
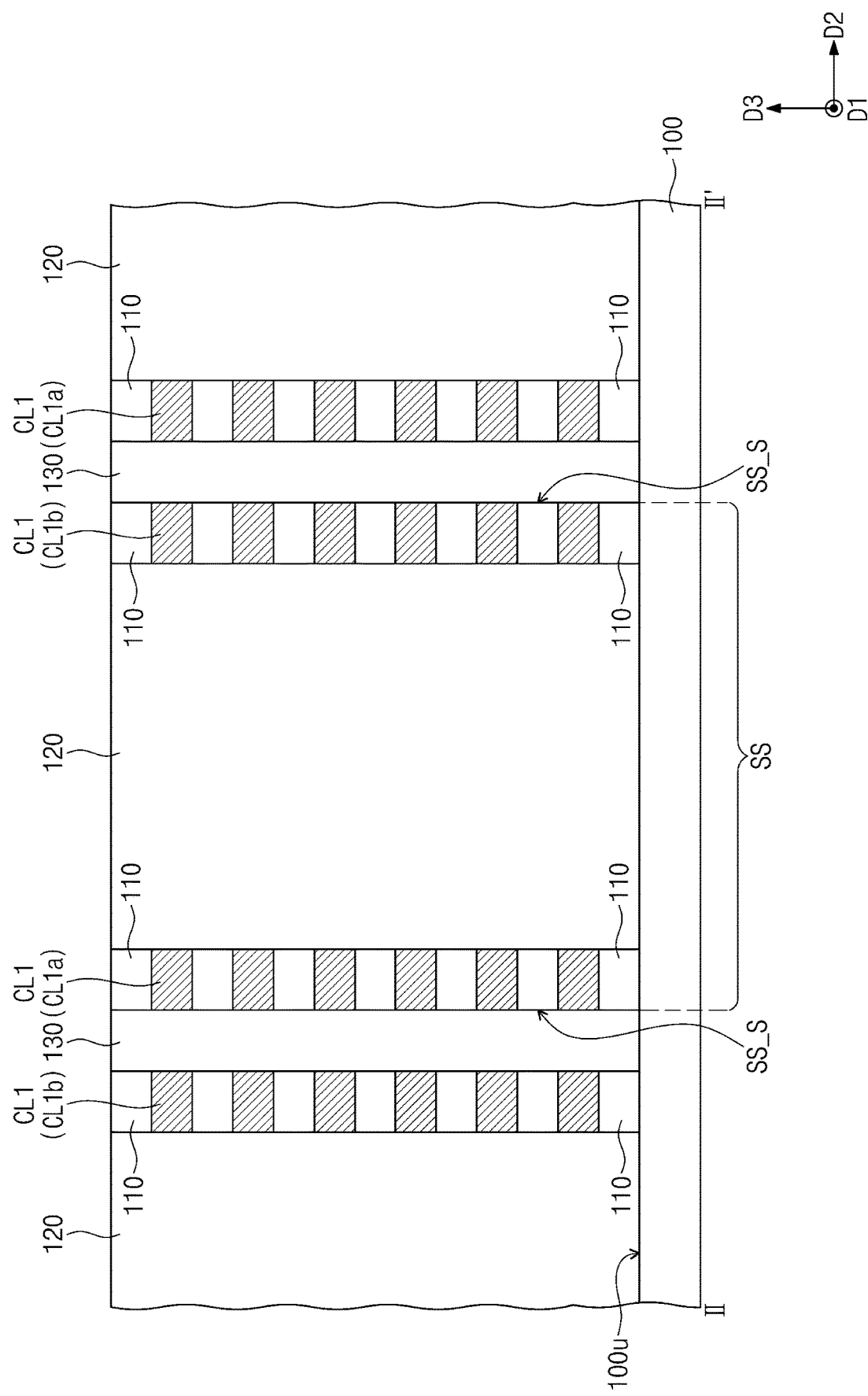
FIG. 5 is a cross-sectional view taken along a line II-II' of FIG. 3.
Figure 6:
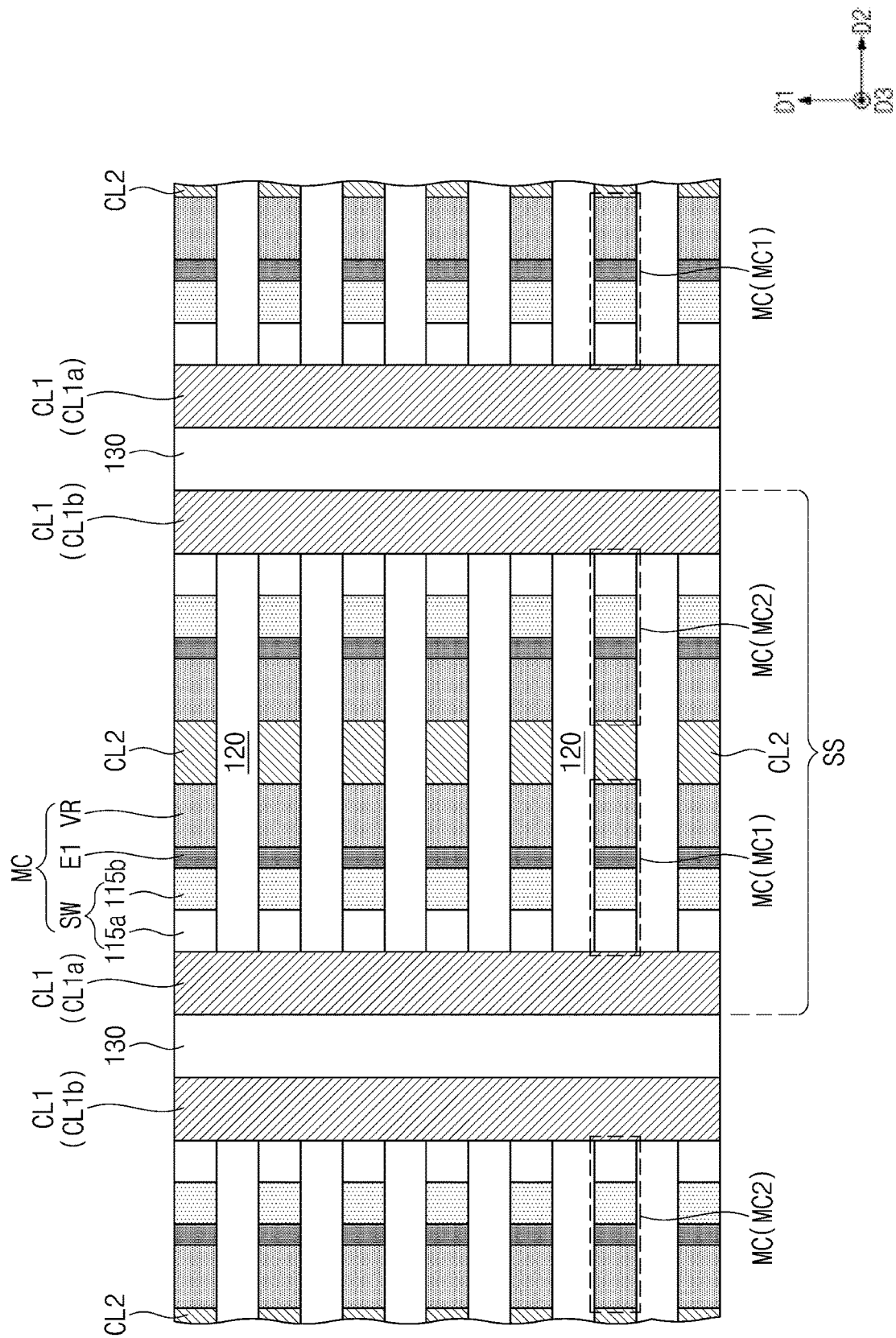
FIG. 6 is a plan view illustrating arrangement of first conductive lines, second conductive lines and memory cells of FIG. 4.

FIG. 3 is a plan view illustrating a variable resistance memory device according to some embodiments of the inventive concepts. FIG. 4 is a cross-sectional view taken along a line I-I' of FIG. 3, and FIG. 5 is a cross-sectional view taken along a line II-II' of FIG. 3. FIG. 6 is a plan view illustrating arrangement of first conductive lines, second conductive lines and memory cells of FIG. 4.

Referring to FIGS. 3 to 6, a stack structure SS may be provided on a substrate 100. The substrate 100 may include a semiconductor substrate. In some embodiments, the substrate 100 may further include a thin layer formed on the semiconductor substrate. However, embodiments of the inventive concepts are not limited thereto. The stack structure SS may extend in a first direction D1 parallel to a top surface 100u of the substrate 100. Isolation insulating patterns 130 may be provided on the substrate 100 at both sides of the stack structure SS, respectively. The isolation insulating patterns 130 may cover both sidewalls SS_S of the stack structure SS, respectively. The isolation insulating patterns 130 may extend in the first direction D1 and may be spaced apart from each other in a second direction D2 which is parallel to the top surface 100u of the substrate 100 and intersects the first direction D1. In other words, the isolation insulating patterns 130 may be spaced apart from each other in the second direction D2 with the stack structure SS interposed therebetween. The stack structure SS may be spaced apart from a neighboring stack structure SS with each of the isolation insulating patterns 130 interposed therebetween. The isolation insulating patterns 130 may include, for example, an oxide, a nitride, and/or an oxynitride.

The stack structure SS may include insulating layers 110 and first conductive lines CL1, which are alternately stacked in a third direction D3 perpendicular to the top surface 100u of the substrate 100. A pair of first conductive lines CL1 among the first conductive lines CL1 may be disposed on each of the insulating layers 110. The pair of first conductive lines CL1 may be spaced apart from each other in the second direction D2 on each of the insulating layers 110 and may be disposed between two of the insulating layers 110, which are adjacent to each other in the third direction D3. A lowermost one of the insulating layers 110 may be disposed between the substrate 100 and lowermost ones of the first conductive lines CL1. However, embodiments of the inventive concepts are not limited thereto.

The first conductive lines CL1 may extend in the first direction D1. The first conductive lines CL1 may include first sub-conductive lines CL1a and second sub-conductive lines CL1b. The first sub-conductive lines CL1a may extend in the first direction D1 and may be spaced apart from each other in the third direction D3. The first sub-conductive lines CL1a may be isolated from each other by the insulating layers 110 interposed therebetween. The second sub-conductive lines CL1b may extend in the first direction D1 and may be spaced apart from each other in the third direction D3. The second sub-conductive lines CL1*b* may be isolated from each other by the insulating layers 110 interposed therebetween. The second sub-conductive lines CL1*b* may be spaced apart from the first sub-conductive lines CL1*a* in the second direction D2. One of the isolation insulating patterns 130 may cover sidewalls of the first sub-conductive lines CL1*a* and sidewalls of the insulating layers 110 disposed between the first sub-conductive lines CL1*a*. Another of the isolation insulating patterns 130 may cover sidewalls of the second sub-conductive lines CL1*b* and sidewalls of the insulating layers 110 disposed between the second sub-conductive lines CL1*b*. The pair of first conductive lines CL1 on each of the insulating layers 110 may include one of the first sub-conductive lines CL1*a* and one of the second sub-conductive lines CL1*b*.

The stack structure SS may further include second conductive lines CL2 disposed between the first sub-conductive lines CL1*a* and the second sub-conductive lines CL1*b*. The second conductive lines CL2 may extend from the top surface 100*u* of the substrate 100 in the third direction D3 and may be spaced apart from each other in the first direction D1. The second conductive lines CL2 may intersect the first sub-conductive lines CL1*a* and the second sub-conductive lines CL1*b*. Each of the second conductive lines CL2 may penetrate the insulating layers 110. The first conductive lines CL1 and the second conductive lines CL2 may include a metal (e.g., copper, tungsten, or aluminum) and/or a metal nitride (e.g., tantalum nitride, titanium nitride, or tungsten nitride). The insulating layers 110 may include, for example, silicon nitride.

The stack structure SS may further include filling insulation patterns 120 disposed between the first sub-conductive lines CL1*a* and the second sub-conductive lines CL1*b*. The filling insulation patterns 120 may extend from the top surface 100*u* of the substrate 100 in the third direction D3 and may be spaced apart from each other in the first direction D1. The second conductive lines CL2 and the filling insulation patterns 120 may be alternately arranged in the first direction D1 between the first sub-conductive lines CL1*a* and the second sub-conductive lines CL1*b*. Each of the second conductive lines CL2 may be disposed between two of the filling insulation patterns 120, which are adjacent to each other in the first direction D1. Each of the filling insulation patterns 120 may extend in the second direction D2 between the first sub-conductive lines CL1*a* and the second sub-conductive lines CL1*b* and may be in contact with sidewalls of the first sub-conductive lines CL1*a* and sidewalls of the second sub-conductive lines CL1*b*. Each of the filling insulation patterns 120 may penetrate the insulating layers 110. The filling insulation patterns 120 may include, for example, an oxide, a nitride, and/or an oxynitride.

The stack structure SS may include memory cells MC that are provided at intersecting points of the first conductive lines CL1 and the second conductive lines CL2, respectively. The memory cells MC may include first memory cells MC1 provided at intersecting points of the first sub-conductive lines CL1*a* and the second conductive lines CL2, respectively, and second memory cells MC2 provided at intersecting points of the second sub-conductive lines CL1*b* and the second conductive lines CL2, respectively. The first memory cells MC1 may be disposed between the first sub-conductive lines CL1*a* and the second conductive lines CL2 and may be spaced apart from each other in the first direction D1 and the third direction D3. First memory cells MC, of the first memory cells MC1, spaced apart from each other in the first direction D1 and arranged in the first direction D1 may be respectively connected to the second conductive lines CL2 and may be connected in common to a corresponding one of the first sub-conductive lines CL1*a*. The first memory cells MC1 spaced apart from each other in the first direction D1 may be isolated from each other by the filling insulation patterns 120 interposed therebetween. First memory cells MC, of the first memory cells MC1, spaced apart from each other in the third direction D3 and arranged in the third direction D3 may be respectively connected to the first sub-conductive lines CL1*a* and may be connected in common to a corresponding one of the second conductive lines CL2. The first memory cells MC1 spaced apart from each other in the third direction D3 may be isolated from each other by the insulating layers 110 interposed therebetween.

The second memory cells MC2 may be disposed between the second sub-conductive lines CL1*b* and the second conductive lines CL2 and may be spaced apart from each other in the first direction D1 and the third direction D3. Second memory cells MC2, of the second memory cells MC2, spaced apart from each other in the first direction D1 and arranged in the first direction D1 may be respectively connected to the second conductive lines CL2 and may be connected in common to a corresponding one of the second sub-conductive lines CL1*b*. The second memory cells MC2 spaced apart from each other in the first direction D1 may be isolated from each other by the filling insulation patterns 120 interposed therebetween. Second memory cells MC2, of the second memory cells MC2, spaced apart from each other in the third direction D3 and arranged in the third direction D3 may be respectively connected to the second sub-conductive lines CL1*b* and may be connected in common to a corresponding one of the second conductive lines CL2. The second memory cells MC2 spaced apart from each other in the third direction D3 may be isolated from each other by the insulating layers 110 interposed therebetween. The second memory cells MC2 may be spaced apart from the first memory cells MC1 in the second direction D2.

Each of the memory cells MC may include a variable resistance element VR, a selection element SW, and a first electrode E1 disposed between the variable resistance element VR and the selection element SW. The variable resistance element VR, the first electrode E1 and the selection element SW may be arranged in a direction (e.g., the second direction D2) parallel to the top surface 100*u* of the substrate 100. Each of the memory cells MC may be locally provided between a pair of the filling insulation patterns 120 adjacent to each other in the first direction D1 and between a pair of the insulating layers 110 adjacent to each other in the third direction D3. Thus, the variable resistance element VR, the first electrode E1 and the selection element SW may be horizontally arranged in the second direction D2 between the pair of filling insulation patterns 120 and between the pair of insulating layers 110. The variable resistance element VR and the selection element SW included in each of the first memory cells MC1 may be connected in series between a corresponding one of the first sub-conductive lines CL1*a* and a corresponding one of the second conductive lines CL2. The variable resistance element VR and the selection element SW included in each of the second memory cells MC2 may be connected in series between a corresponding one of the second sub-conductive lines CL1*b* and a corresponding one of the second conductive lines CL2.

The memory cells MC may include a pair of memory cells MC spaced apart from each other in the second direction D2 with a corresponding second conductive line CL2 interposed therebetween. The pair of memory cells MC may include one of the first memory cells MC1 and one of the second memory cells MC2. The pair of memory cells MC may be connected in common to the corresponding second conductive line CL2 and may be connected to a corresponding one of the first sub-conductive lines CL1a and a corresponding one of the second sub-conductive lines CL1b, respectively. The corresponding second conductive line CL2 and the pair of memory cells MC connected thereto may be arranged in the second direction D2 on one surface of a corresponding filling insulation pattern 120. For example, the corresponding second conductive line CL2 and the pair of memory cells MC connected thereto may be arranged in the second direction D2 between two of the filling insulation patterns 120, which are adjacent to each other in the first direction D1.

The pair of memory cells MC may be symmetrical with respect to the corresponding second conductive line CL2. In some embodiments, the variable resistance element VR of the first memory cell MC1 and the variable resistance element VR of the second memory cell MC2 may be connected in common to the corresponding second conductive line CL2, and the selection element SW of the first memory cell MC1 and the selection element SW of the second memory cell MC2 may be connected to the corresponding first sub-conductive line CL1a and the corresponding second sub-conductive line CL1b, respectively. In certain embodiments, unlike FIGS. 4 and 6, the selection element SW of the first memory cell MC1 and the selection element SW of the second memory cell MC2 may be connected in common to the corresponding second conductive line CL2, and the variable resistance element VR of the first memory cell MC1 and the variable resistance element VR of the second memory cell MC2 may be connected to the corresponding first sub-conductive line CL1a and the corresponding second sub-conductive line CL1b, respectively.

The variable resistance element VR may include a material capable of storing information (or data) using its resistance change. For example, the variable resistance element VR may include a material of which a phase is reversibly changeable between a crystalline state and an amorphous state by a temperature. In some embodiments, the variable resistance element VR may include a compound which includes a chalcogen element (e.g., Te and/or Se) and at least one of Ge, Sb, Bi, Pb, Sn, Ag, As, S, Si, In, Ti, Ga, P, O, or C. For example, the variable resistance element VR may include at least one of GeSbTe, GeTeAs, SbTeSe, GeTe, SbTe, SeTeSn, GeTeSe, SbSeBi, GeBiTe, GeTeTi, InSe, GaTeSe, or InSbTe. In certain embodiments, the variable resistance element VR may have a superlattice structure in which layers including Ge and layers not including Ge are alternately and repeatedly stacked (e.g., a structure in which GeTe layers and SbTe layers are alternately and repeatedly stacked). In certain embodiments, the variable resistance element VR may include at least one of perovskite compounds or conductive metal oxides. The variable resistance element VR may have a double-layer structure of a conductive metal oxide layer and a tunnel insulating layer or may have a triple-layer structure of a first conductive metal oxide layer, a tunnel insulating layer and a second conductive metal oxide layer. In this case, the tunnel insulating layer may include aluminum oxide, hafnium oxide, or silicon oxide.

In some embodiments, the selection element SW may be a diode. In this case, the selection element SW may include a first junction pattern 115a and a second junction pattern 115b, which have different conductivity types from each other. The first junction pattern 115a may have a first conductivity type, and the second junction pattern 115b may have a second conductivity type different from the first conductivity type. The first conductivity type may be a P-type and the second conductivity type may be an N-type. Alternatively, the first conductivity type may be the N-type and the second conductivity type may be the P-type. The second junction pattern 115b may include dopants of the second conductivity type (hereinafter, referred to as second conductivity type dopants). The first junction pattern 115a may include dopants of the first conductivity type (hereinafter, referred to as first conductivity type dopants) and the second conductivity type dopants. Here, in the first junction pattern 115a, a concentration of the first conductivity type dopants may be greater than a concentration of the second conductivity type dopants. In some embodiments, the selection element SW may be a silicon diode or oxide diode which has a rectifying property. In other words, the selection element SW may be a silicon diode of P-type silicon and N-type silicon or may be an oxide diode of P-type $NiO_x$ and N-type $TiO_x$ or an oxide diode of P-type $CuO_x$ and N-type $TiO_x$.

In some embodiments, the first electrode E1 may include a metal. For example, the first electrode E1 may include at least one of W, Ti, Al, Cu, C, CN, TiN, TiAlN, TiSiN, TiCN, WN, CoSiN, WSiN, TaN, TaCN, TaSiN, or TiO. In certain embodiments, the first electrode E1 may include a metal silicide.

According to the embodiments of the inventive concepts, the stack structure SS may include the first sub-conductive lines CL1a, the second sub-conductive lines CL1b spaced apart from the first sub-conductive lines CL1a, the second conductive lines CL2 extending in a direction (e.g., the third direction D3) perpendicular to the top surface 100u of the substrate 100 between the first sub-conductive lines CL1a and the second sub-conductive lines CL1b, and the memory cells MC provided at the intersecting points of the first sub-conductive lines CL1a and the second conductive lines CL2 and the intersecting points of the second sub-conductive lines CL1b and the second conductive lines CL2, respectively. Since the second conductive lines CL2 extend in the third direction D3, it may be easy to vertically stack the memory cells MC on the top surface 100u of the substrate 100. In addition, each of the memory cells MC may include the variable resistance element VR and the selection element SW, which are horizontally arranged in a direction (e.g., the second direction D2) parallel to the top surface 100u of the substrate 100. Thus, the memory cells MC may be easily formed.

FIGS. 7A to 11A are plan views illustrating a method of manufacturing a variable resistance memory device according to some embodiments of the inventive concepts. FIGS. 7B to 11B are cross-sectional views taken along lines I-I' of FIGS. 7A to 11A, respectively, and FIGS. 7C to 11C are cross-sectional views taken along lines II-II' of FIGS. 7A to 11A, respectively.

Figure 7A:
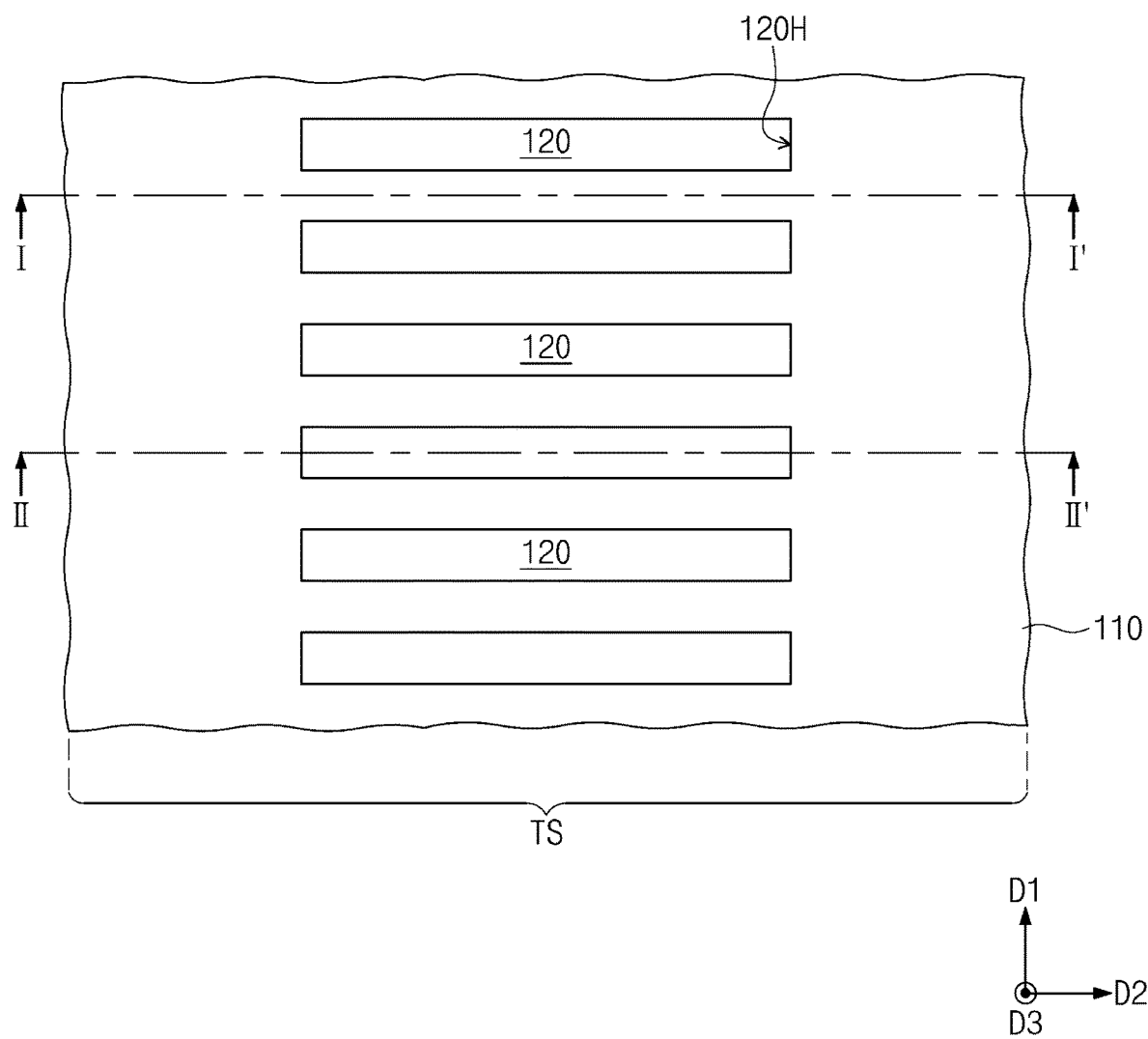
Figure 7B:
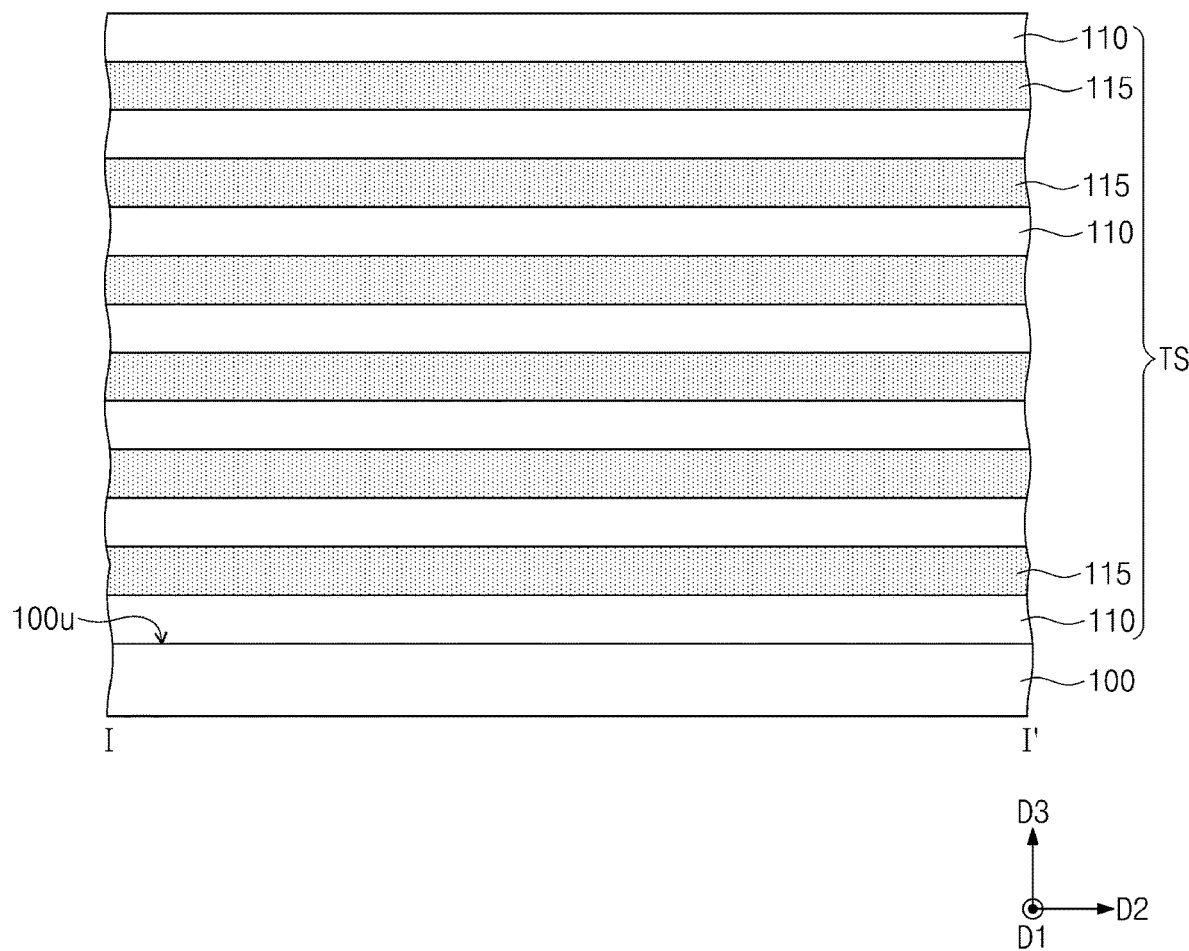

Referring to FIGS. 7A to 7C, a thin-layer structure TS may be formed on a substrate 100. The thin-layer structure TS may include insulating layers 110 and sacrificial layers 115, which are stacked on a top surface 100u of the substrate 100. The insulating layers 110 and the sacrificial layers 115 may be alternately and repeatedly stacked in the third direction D3 perpendicular to the top surface 100u of the substrate 100. A lowermost one of the insulating layers 110 may be disposed between the substrate 100 and a lowermost one of the sacrificial layers 115. However, embodiments of the inventive concepts are not limited thereto. The sacrificial layers 115 may include silicon doped with second conductivity type dopants or a metal oxide doped with the second conductivity type dopants. The insulating layers 110 may include a material having an etch selectivity with respect to the sacrificial layers 115. The insulating layers 110 may include, for example, silicon nitride.

Filling insulation patterns 120 may be formed in the thin-layer structure TS. In the thin-layer structure TS, the filling insulation patterns 120 may be spaced apart from each other in the first direction D1 and may extend in the second direction D2. The filling insulation patterns 120 may penetrate the thin-layer structure TS and may be in contact with the top surface 100u of the substrate 100. In some embodiments, the formation of the filling insulation patterns 120 may include forming through-holes 120H penetrating the thin-layer structure TS, forming a filling insulation layer filling the through-holes 120H on the thin-layer structure TS, and planarizing the filling insulation layer until a top surface of the thin-layer structure TS is exposed. In some embodiments, the formation of the through-holes 120H may include forming a mask pattern defining regions, in which the filling insulation patterns 120 will be formed, on the thin-layer structure TS, and etching the thin-layer structure TS using the mask pattern as an etch mask. The through-holes 120H may be spaced apart from each other in the first direction D1, and each of the through-holes 120H may have a line shape extending in the second direction D2. The through-holes 120H may expose the top surface 100u of the substrate 100. Since the filling insulation layer is planarized, the filling insulation patterns 120 may be locally formed in the through-holes 120H, respectively. The filling insulation patterns 120 may include, for example, an oxide, a nitride, and/or an oxynitride.

Figure 8A:
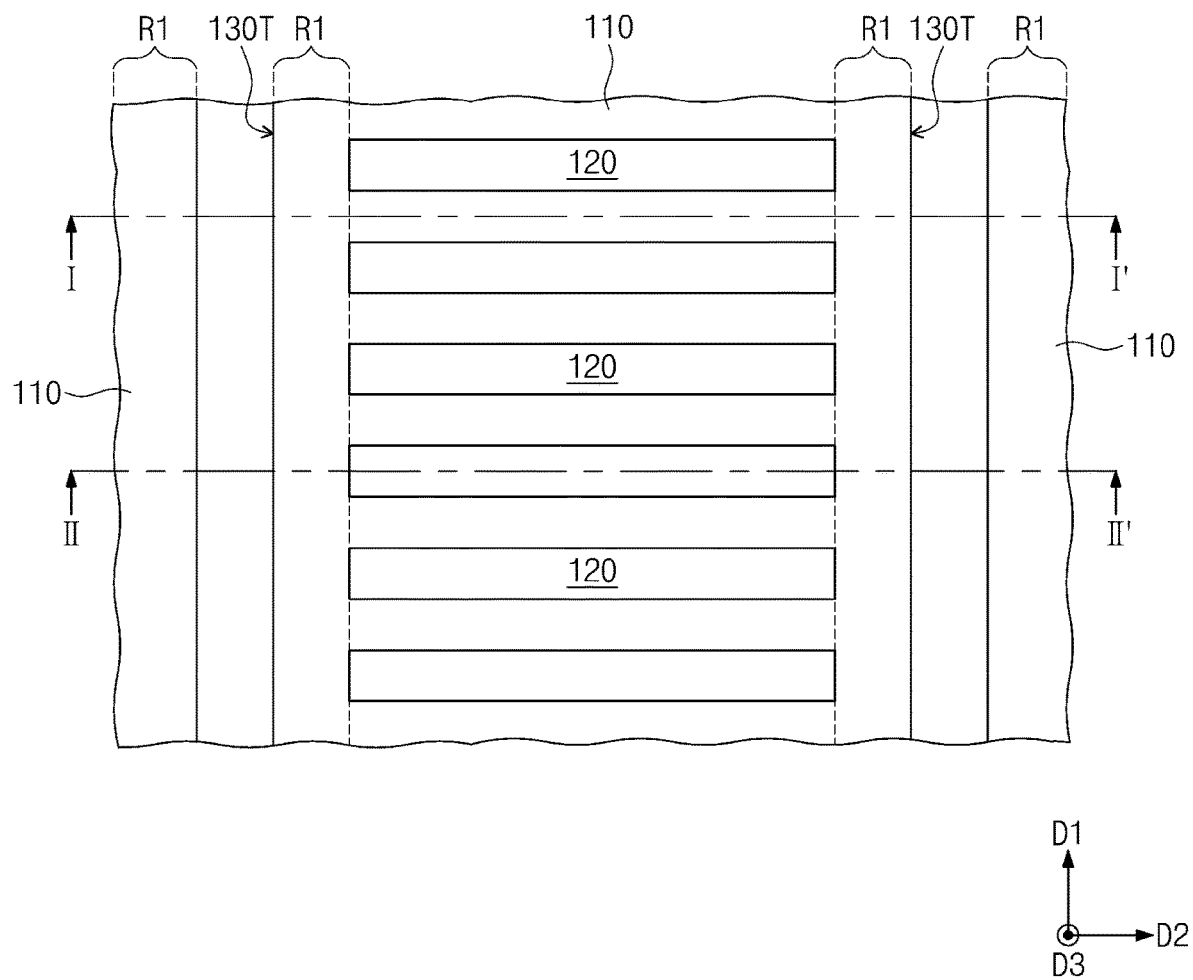

Referring to FIGS. 8A to 8C, a pair of trenches 130T may be formed to penetrate the thin-layer structure TS. The pair of trenches 130T may extend in the first direction D1 and may be spaced apart from each other in the second direction D2. The pair of trenches 130T may be spaced apart from each other in the second direction D2 with the filling insulation patterns 120 interposed therebetween. Each of the pair of trenches 130T may expose sidewalls of the insulating layers 110 and the sacrificial layers 115 of the thin-layer structure TS and may also expose the top surface 100u of the substrate 100. In some embodiments, the formation of the trenches 130T may include forming a mask pattern defining regions, in which the trenches 130T will be formed, on the thin-layer structure TS, and etching the thin-layer structure TS using the mask pattern as an etch mask.

The sidewalls of the sacrificial layers 115, which are exposed by each of the trenches 130T, may be recessed to form first recess regions R1 between the insulating layers 110. In some embodiments, the formation of the first recess regions R1 may include etching the sacrificial layers 115 by performing an etching process having an etch selectivity with respect to the insulating layers 110, the filling insulation patterns 120 and the substrate 100. The first recess regions R1 may laterally extend from each of the trenches 130T. The first recess regions R1 may extend in the first direction D1 and may be spaced apart from each other in the third direction D3. Each of the first recess regions R1 may be formed between a pair of the insulating layers 110 adjacent to each other in the third direction D3. Each of the first recess regions R1 may extend in the first direction D1 to expose sidewalls of the filling insulation patterns 120 and sidewalls of the sacrificial layers 115 between the filling insulation patterns 120.

Figure 9A:
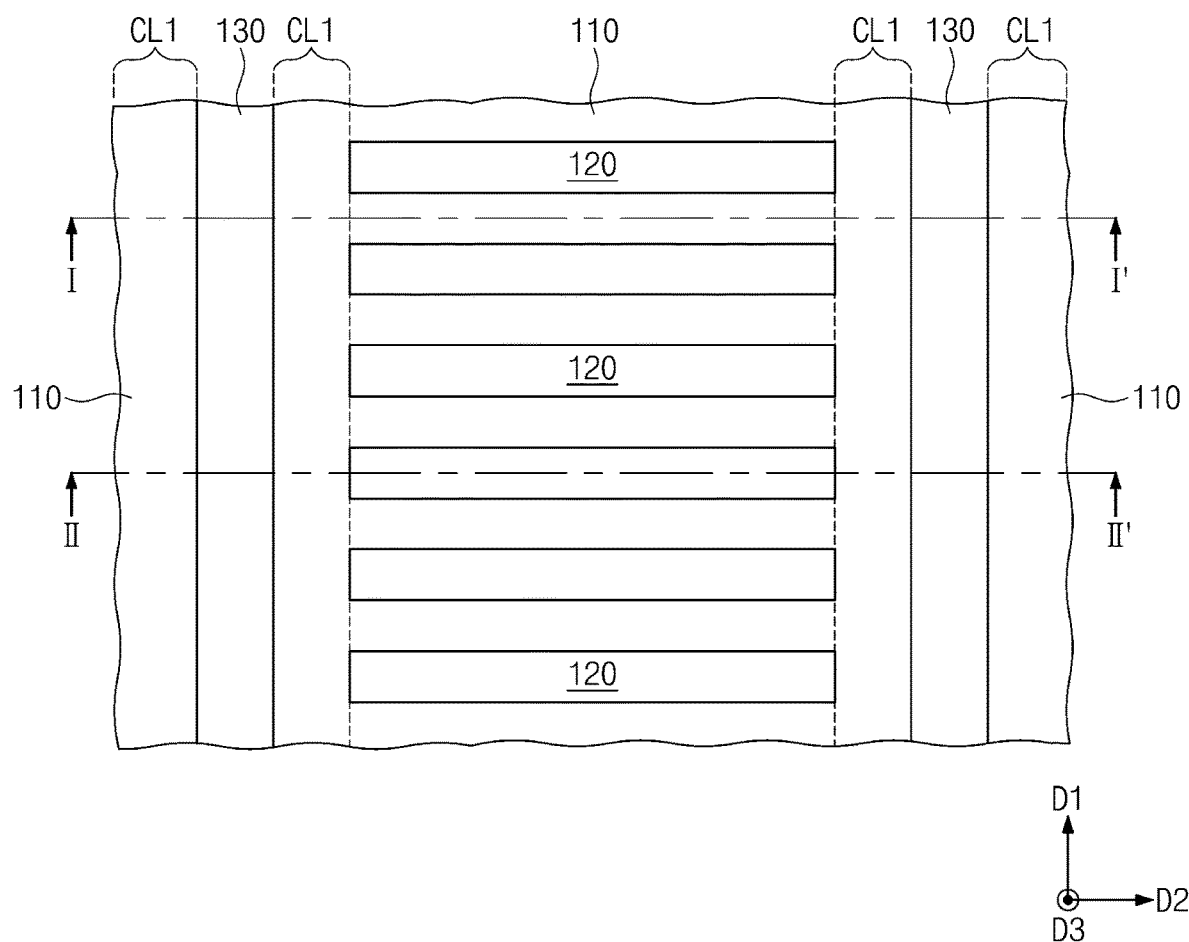
Figure 9B:
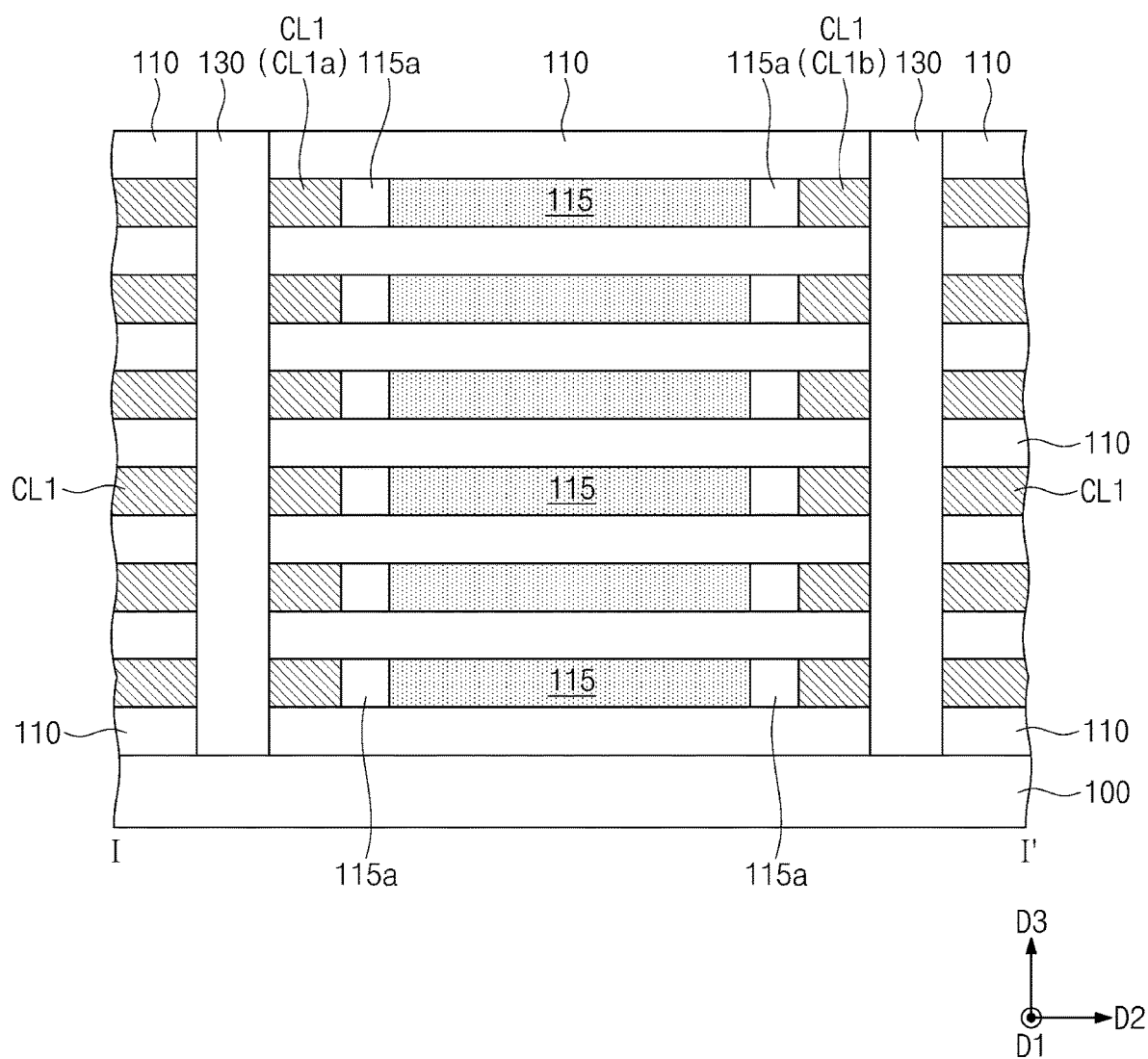
Figure 9C:
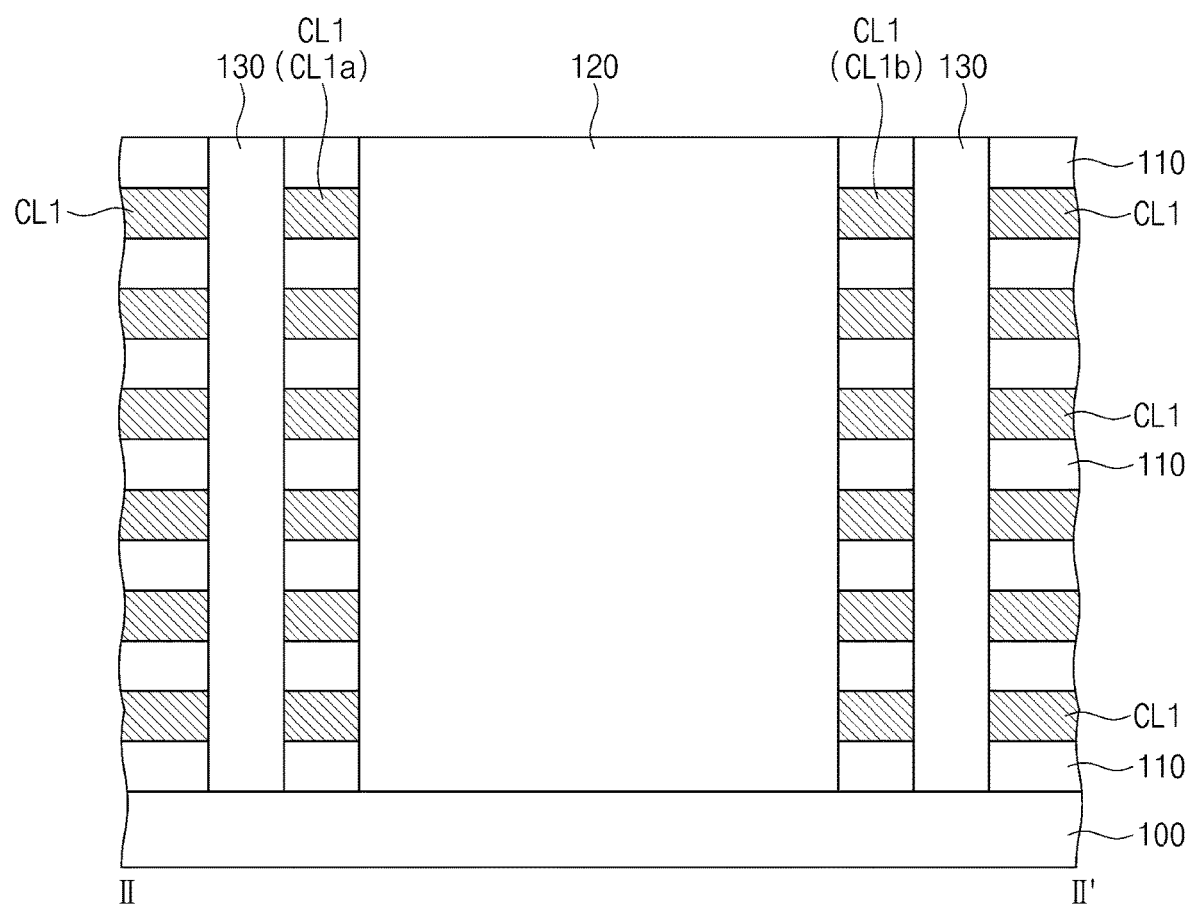

Referring to FIGS. 9A to 9C, portions of the sacrificial layers 115 exposed by the first recess regions R1 may be doped with first conductivity type dopants. Thus, a first junction pattern 115a may be formed at a side of each of the sacrificial layers 115. The first conductivity type dopants may be different from the second conductivity type dopants. The sacrificial layers 115 may include the second conductivity type dopants, and the first junction pattern 115a may be formed by doping a portion of each of the sacrificial layers 115 with the first conductivity type dopants. Thus, the first junction pattern 115a may include the first conductivity type dopants and the second conductivity type dopants. In the first junction pattern 115a, a concentration of the first conductivity type dopants may be greater than a concentration of the second conductivity type dopants.

After the formation of the first junction pattern 115a, first conductive lines CL1 may be formed in the first recess regions R1, respectively. In some embodiments, the formation of the first conductive lines CL1 may include forming a first conductive layer filling the first recess regions R1 and at least a portion of each of the trenches 130T on the thin-layer structure TS, and removing the first conductive layer disposed outside the first recess regions R1. The first conductive layer may include a metal (e.g., copper, tungsten, or aluminum) and/or a metal nitride (e.g., tantalum nitride, titanium nitride, or tungsten nitride). The removal of the first conductive layer may include etching the first conductive layer until the top surface of the thin-layer structure TS and inner surfaces of the trenches 130T are exposed. Since the first conductive layer is etched, the first conductive lines CL1 may be locally formed in the first recess regions R1, respectively. Each of the first conductive lines CL1 may extend in the first direction D1 and may be in contact with the sidewalls of the filling insulation patterns 120 and sidewalls of the first junction patterns 115a between the filling insulation patterns 120.

The first conductive lines CL1 may include first sub-conductive lines CL1a and second sub-conductive lines CL1b. The second sub-conductive lines CL1b may be spaced apart from the first sub-conductive lines CL1a in the second direction D2 with the filling insulation patterns 120 interposed therebetween. The first sub-conductive lines CL1a may extend in the first direction D1 and may be spaced apart from each other in the third direction D3. The first sub-conductive lines CL1a may be isolated from each other by the insulating layers 110 interposed therebetween. The second sub-conductive lines CL1b may extend in the first direction D1 and may be spaced apart from each other in the third direction D3. The second sub-conductive lines CL1b may be isolated from each other by the insulating layers 110 interposed therebetween. Each of the first and second sub-conductive lines CL1a and CL1b may extend in the first direction D1 so as to be in contact with the sidewalls of the filling insulation patterns 120 and the sidewalls of the first junction patterns 115a between the filling insulation patterns 120.

Isolation insulating patterns 130 may be formed in the trenches 130T, respectively. In some embodiments, the formation of the isolation insulating patterns 130 may include forming an isolation insulating layer filling the trenches 130T on the thin-layer structure TS, and planarizing the isolation insulating layer until the top surface of the thin-layer structure TS is exposed. The isolation insulating patterns 130 may be locally formed in the trenches 130T by the planarization process. The isolation insulating patterns 130 may extend in the first direction D1 and may be spaced apart from each other in the second direction D2 with the first conductive lines CL1 interposed therebetween. The isolation insulating patterns 130 may include, for example, an oxide, a nitride, and/or an oxynitride.

Figure 10A:
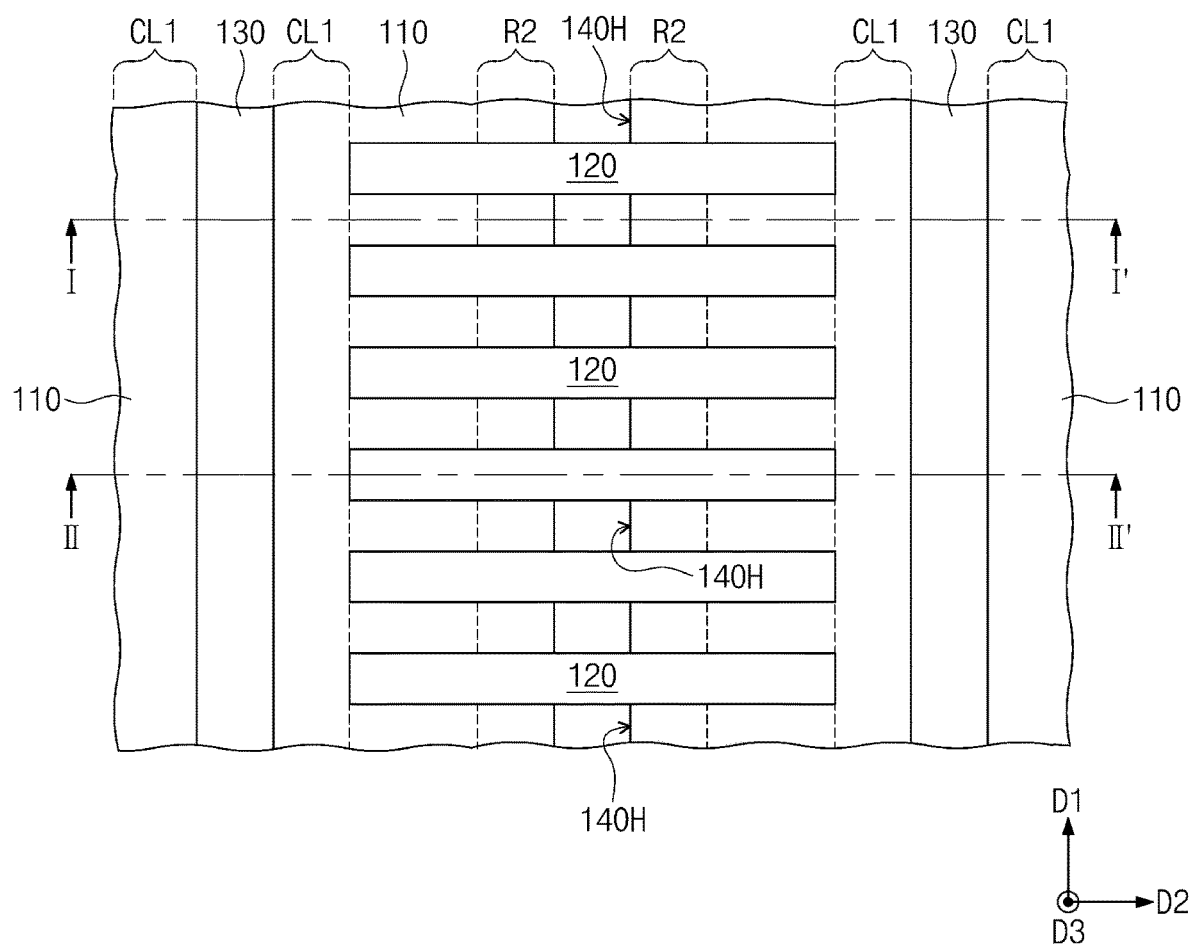
Figure 10B:
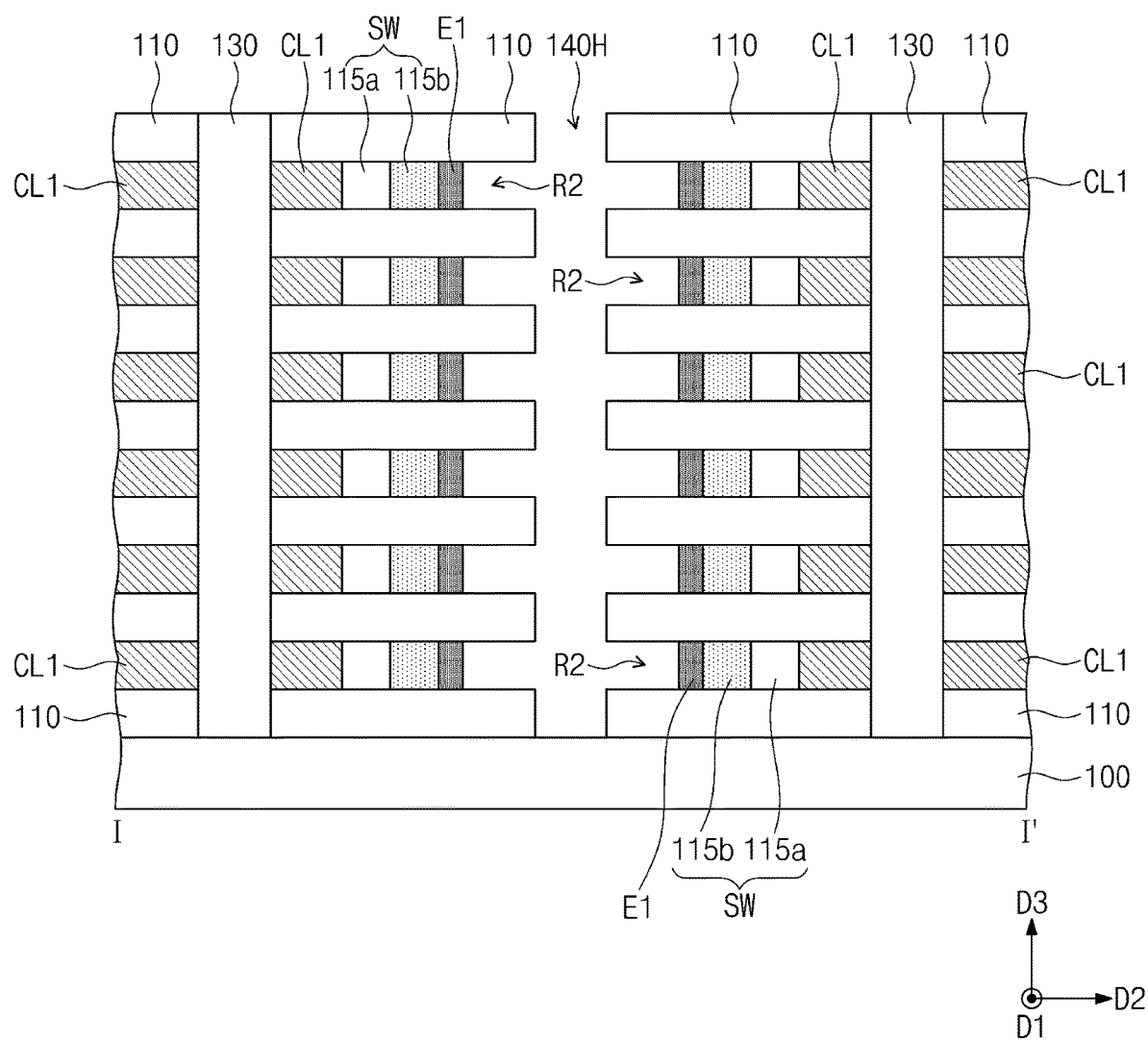

Referring to FIGS. 10A to 10C, vertical holes 140H may be formed to penetrate the thin-layer structure TS. The vertical holes 140H may be spaced apart from each other in the first direction D1 between the isolation insulating patterns 130. The vertical holes 140H and the filling insulation patterns 120 may be alternately arranged in the first direction D1. Each of the vertical holes 140H may expose sidewalls of the insulating layers 110 and the sacrificial layers 115 of the thin-layer structure TS and may also expose the top surface 100u of the substrate 100. Each of the vertical holes 140H may expose sidewalls of a pair of the filling insulation patterns 120 adjacent to each other in the first direction D1. In some embodiments, the formation of the vertical holes 140H may include forming a mask pattern defining regions, in which the vertical holes 140H will be formed, on the thin-layer structure TS, and etching the thin-layer structure TS using the mask pattern as an etch mask.

The sidewalls of the sacrificial layers 115, which are exposed by each of the vertical holes 140H, may be recessed to form second recess regions R2 between the insulating layers 110. In some embodiments, the formation of the second recess regions R2 may include etching the sacrificial layers 115 by performing an etching process having an etch selectivity with respect to the insulating layers 110, the filling insulation patterns 120 and the substrate 100. The second recess regions R2 may laterally extend from each of the vertical holes 140H. Each of the second recess regions R2 may be formed between a pair of the insulating layers 110 adjacent to each other in the third direction D3 and between a pair of the filling insulation patterns 120 adjacent to each other in the first direction D1. Each of the second recess regions R2 may expose a sidewall of a corresponding one of the sacrificial layers 115.

A first electrode E1 may be formed at a side of the sacrificial layer 115 exposed by each of the second recess regions R2. In some embodiments, the formation of the first electrode E1 may include forming a metal layer covering the sidewall of the sacrificial layer 115 exposed by each of the second recess regions R2, performing a thermal treatment process to react the sidewall of the sacrificial layer 115 with the metal layer, and removing a remaining portion of the metal layer which does not react with the sidewall of the sacrificial layer 115. In this case, the first electrode E1 may include a metal silicide. A remaining portion of the sacrificial layer 115, which does not react with the metal layer, may be defined as a second junction pattern 115b. The second junction pattern 115b may include the second conductivity type dopants. The first junction pattern 115a and the second junction pattern 115b may constitute a selection element SW. The first junction pattern 115a and the second junction pattern 115b may have the first conductivity type and the second conductivity type, respectively.

In certain embodiments, the formation of the first electrode E1 may include forming a metal layer filling the second recess regions R2 and at least a portion of each of the vertical holes 140H on the thin-layer structure TS, removing the metal layer from the vertical holes 140H, and recessing the metal layer until the metal layer of a desired thickness remains in each of the second recess regions R2. In this case, the first electrode E1 may include a metal. A remaining portion of the sacrificial layer 115 exposed by each of the second recess regions R2 may be defined as the second junction pattern 115b.

Figure 11A:
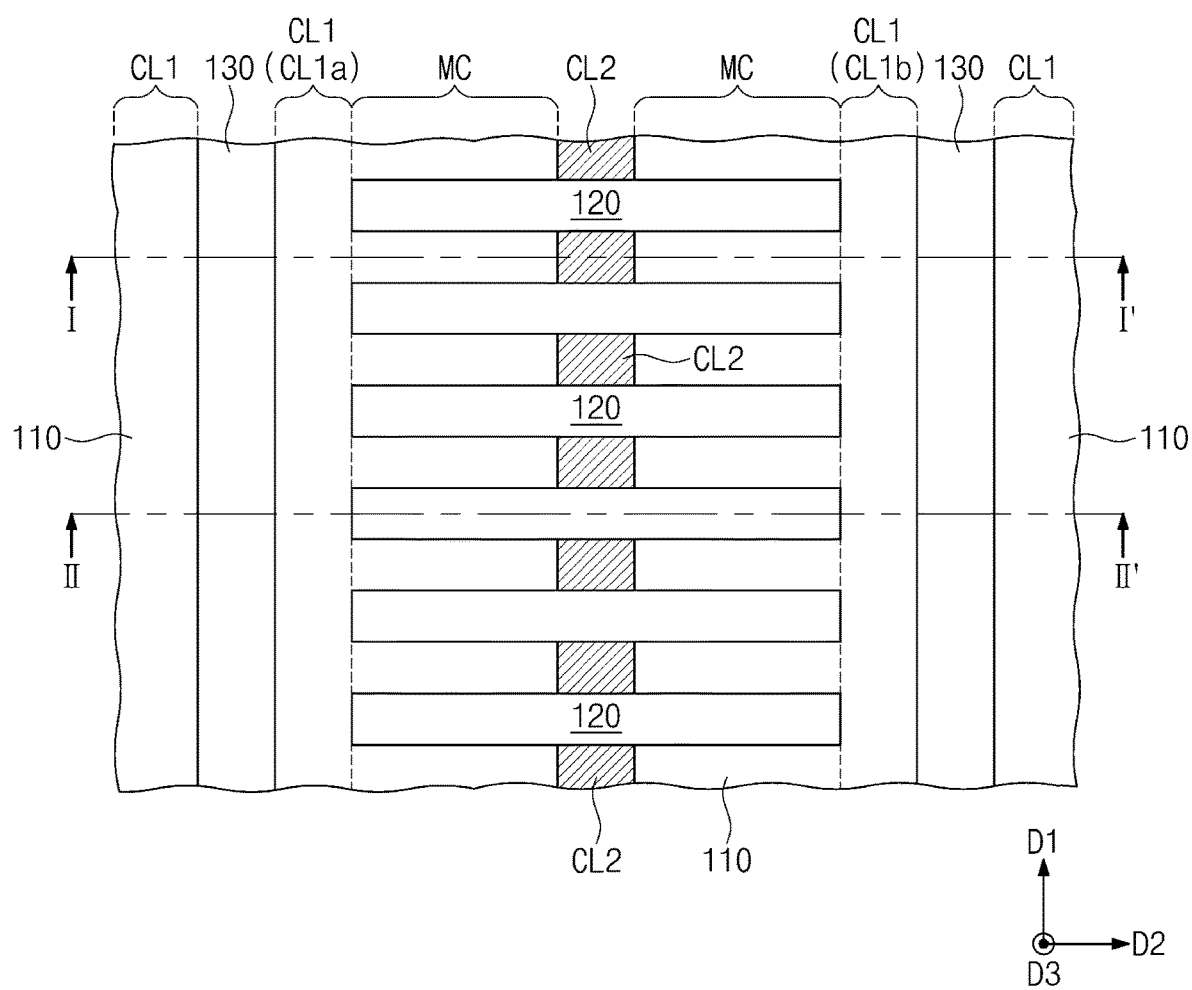

Referring to FIGS. 11A to 11C, a variable resistance element VR may be formed in each of the second recess regions R2. The formation of the variable resistance element VR may include forming a variable resistance material layer filling the second recess regions R2 and at least a portion of each of the vertical holes 140H on the thin-layer structure TS, and removing the variable resistance material layer from the vertical holes 140H. The removal of the variable resistance material layer may include etching the variable resistance material layer until the top surface of the thin-layer structure TS and inner surfaces of the vertical holes 140H are exposed. Thus, the variable resistance element VR may be locally formed in each of the second recess regions R2. The selection element SW, the first electrode E1 and the variable resistance element VR may be horizontally arranged in a direction (e.g., the second direction D2) parallel to the top surface 100u of the substrate 100. The selection element SW, the first electrode E1 and the variable resistance element VR may constitute a memory cell MC.

In the case that the selection element SW and the variable resistance element VR are vertically arranged on the top surface 100u of the substrate 100, a selection element material layer and a variable resistance material layer may be sequentially stacked on the top surface 100u of the substrate 100, and then, the selection element SW and the variable resistance element VR may be formed by patterning the selection element material layer and the variable resistance material layer. In this case, difficulty of the patterning process (e.g., a photolithography process and/or an etching process) for forming the selection element SW and the variable resistance element VR may increase as an integration density of a semiconductor device increases.

However, according to the embodiments of the inventive concepts, the selection element SW and the variable resistance element VR may be horizontally arranged on the top surface 100u of the substrate 100. The selection elements SW may be formed by injecting the dopants into the sacrificial layers 115 between the insulating layers 110, and the variable resistance elements VR may be formed by depositing the variable resistance material layer filling empty regions (i.e., the second recess regions R2) between the insulating layers 110. In this case, a photolithography process for forming the selection element SW and the variable resistance element VR may not be required, and difficulty of the etching processes for forming the selection element SW and the variable resistance element VR may be reduced. In other words, it may be easy to form the memory cell MC including the selection element SW and the variable resistance element VR.

Second conductive lines CL2 may be formed in the vertical holes 140H, respectively. The formation of the second conductive lines CL2 may include forming a second conductive layer filling the vertical holes 140H on the thin-layer structure TS, and planarizing the second conductive layer until the top surface of the thin-layer structure TS is exposed. The second conductive layer may include a metal and/or a metal nitride. Since the second conductive layer is planarized, the second conductive lines CL2 may be locally formed in the vertical holes 140H, respectively. Each of the second conductive lines CL2 may be in contact with the top surface 100u of the substrate 100 and may extend in the third direction D3 so as to be in contact with sidewalls of the insulating layers 110 and sidewalls of the variable resistance elements VR between the insulating layers 110. Each of the second conductive lines CL2 may be in contact with sidewalls of a pair of the filling insulation patterns 120 adjacent to each other in the first direction D1.

Figure 12:
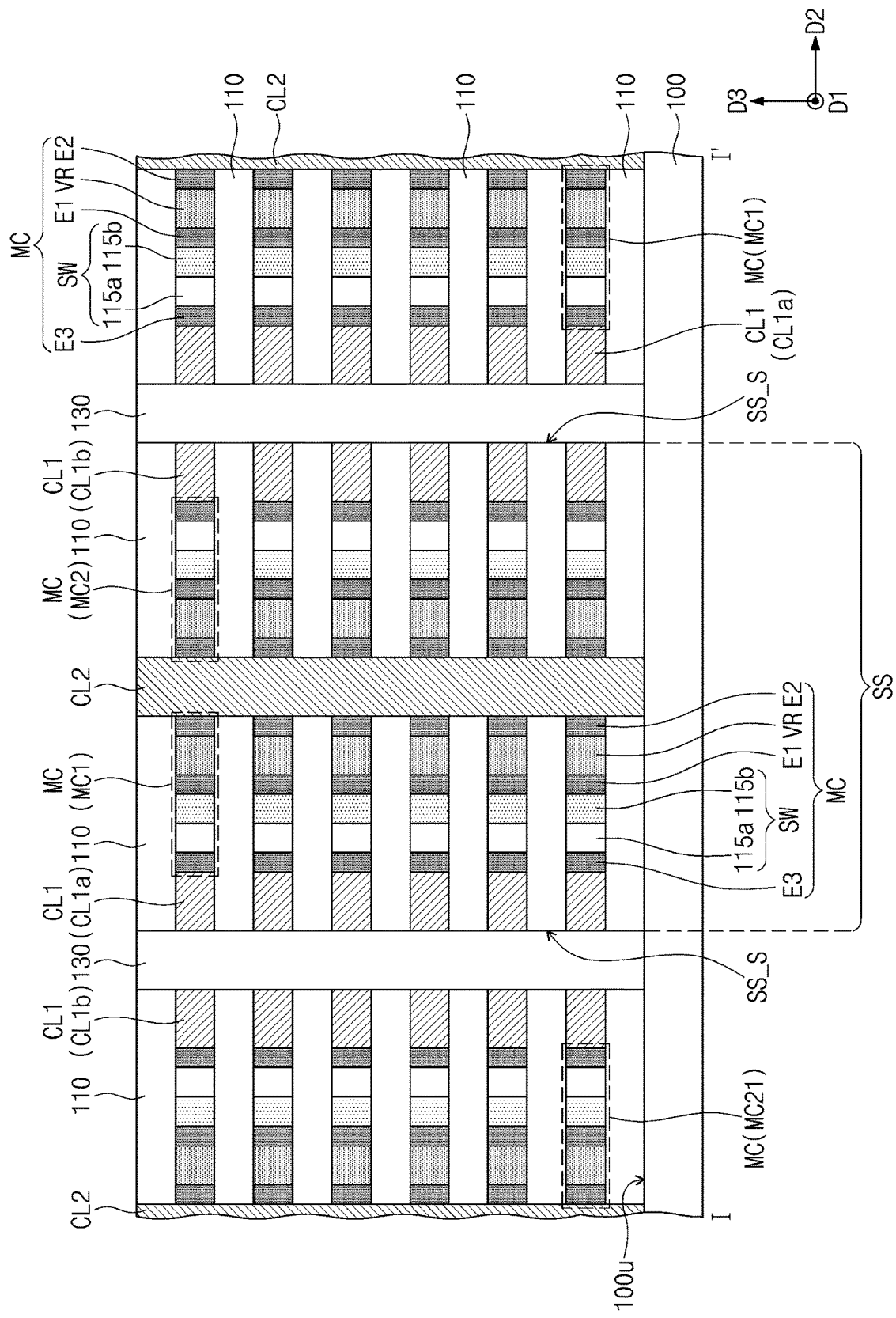
FIG. 12 is a cross-sectional view corresponding to the line I-I' of FIG. 3 to illustrate a variable resistance memory device according to some embodiments of the inventive concepts.
Figure 13:
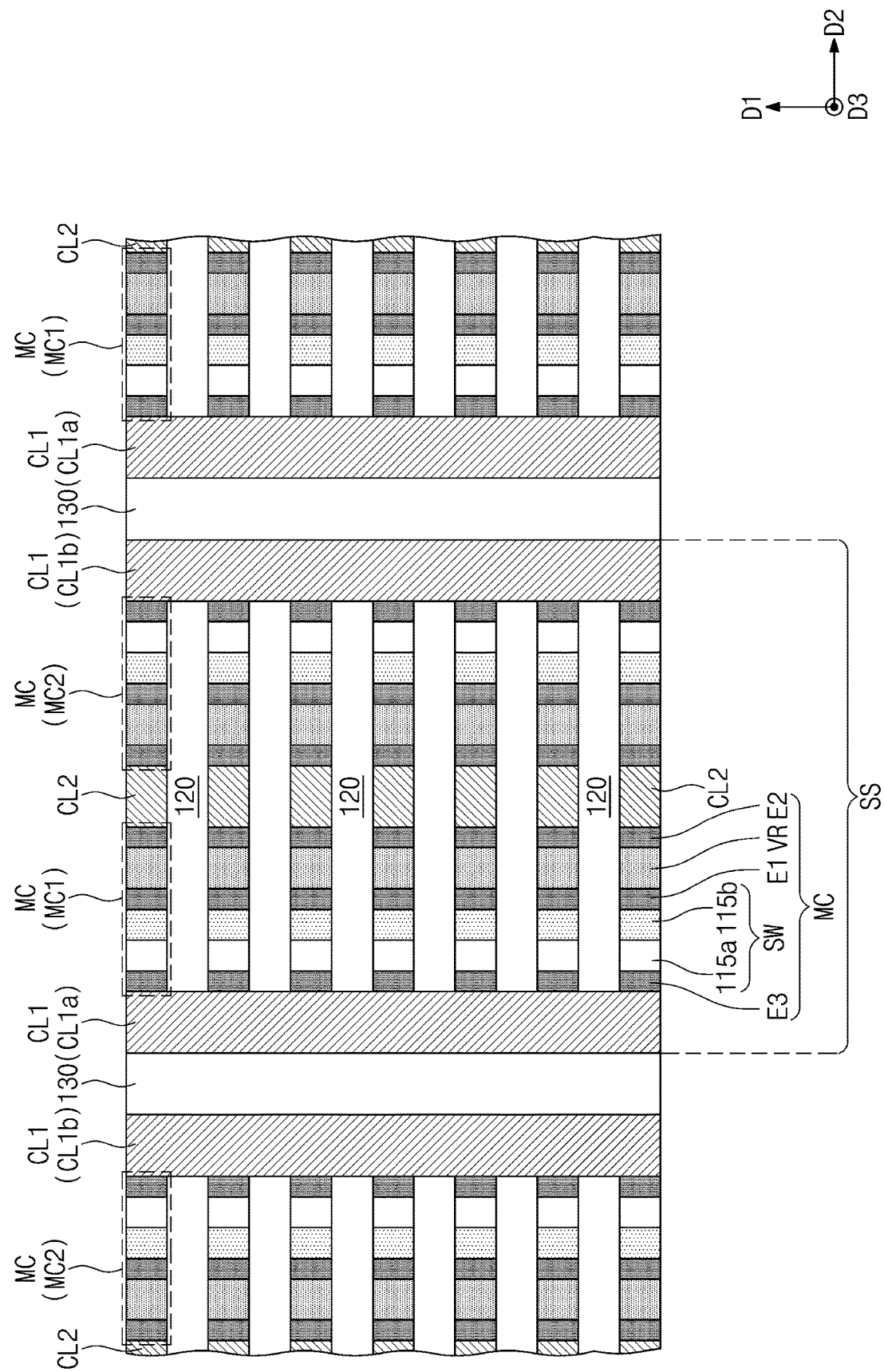
FIG. 13 is a plan view illustrating arrangement of first conductive lines, second conductive lines and memory cells of FIG. 12.

FIG. 12 is a cross-sectional view corresponding to the line I-I' of FIG. 3 to illustrate a variable resistance memory device according to some embodiments of the inventive concepts. FIG. 13 is a plan view illustrating arrangement of first conductive lines, second conductive lines and memory cells of FIG. 12. Hereinafter, differences between the present embodiments and the above embodiments of FIGS. 3 to 6 will be mainly described for the purpose of ease and convenience in explanation.

Referring to FIGS. 12 and 13, each of memory cells MC may include a variable resistance element VR, a selection element SW, a first electrode E1 between the variable resistance element VR and the selection element SW, a second electrode E2 between the variable resistance element VR and a corresponding one of second conductive lines CL2, and a third electrode E3 between the selection element SW and a corresponding one of first conductive lines CL1. The second electrode E2, the variable resistance element VR, the first electrode E1, the selection element SW and the third electrode E3 may be arranged in a direction (e.g., the second direction D2) parallel to the top surface 100u of the substrate 100. Each of the memory cells MC may be locally provided between a pair of the filling insulation patterns 120 adjacent to each other in the first direction D1 and between a pair of the insulating layers 110 adjacent to each other in the third direction D3. Thus, the second electrode E2, the variable resistance element VR, the first electrode E1, the selection element SW and the third electrode E3 may be horizontally arranged in the second direction D2 between the pair of filling insulation patterns 120 and between the pair of insulating layers 110. The variable resistance element VR, the selection element SW and the first electrode E1 may be substantially the same as the variable resistance element VR, the selection element SW and the first electrode E1 of the variable resistance memory device according to the embodiments of FIGS. 3 to 6.

The second electrode E2 may be spaced apart from the first electrode E1 with the variable resistance element VR interposed therebetween. The second electrode E2 may electrically connect the variable resistance element VR to the corresponding one of the second conductive lines CL2. The third electrode E3 may be spaced apart from the first electrode E1 with the selection element SW interposed therebetween. The third electrode E3 may electrically connect the selection element SW to the corresponding one of the first conductive lines CL1. Each of the second and third electrodes E2 and E3 may include a metal. For example, each of the second and third electrodes E2 and E3 may include at least one of W, Ti, Al, Cu, C, CN, TiN, TiAlN, TiSiN, TiCN, WN, CoSiN, WSiN, TaN, TaCN, TaSiN, or TiO. In some embodiments, one of the second electrode E2 and the third electrode E3 may be omitted. When the second electrode E2 is omitted, the variable resistance element VR may be in direct contact with the corresponding one of the second conductive lines CL2. When the third electrode E3 is omitted, the selection element SW may be in direct contact with the corresponding one of the first conductive lines CL1.

Figure 14:
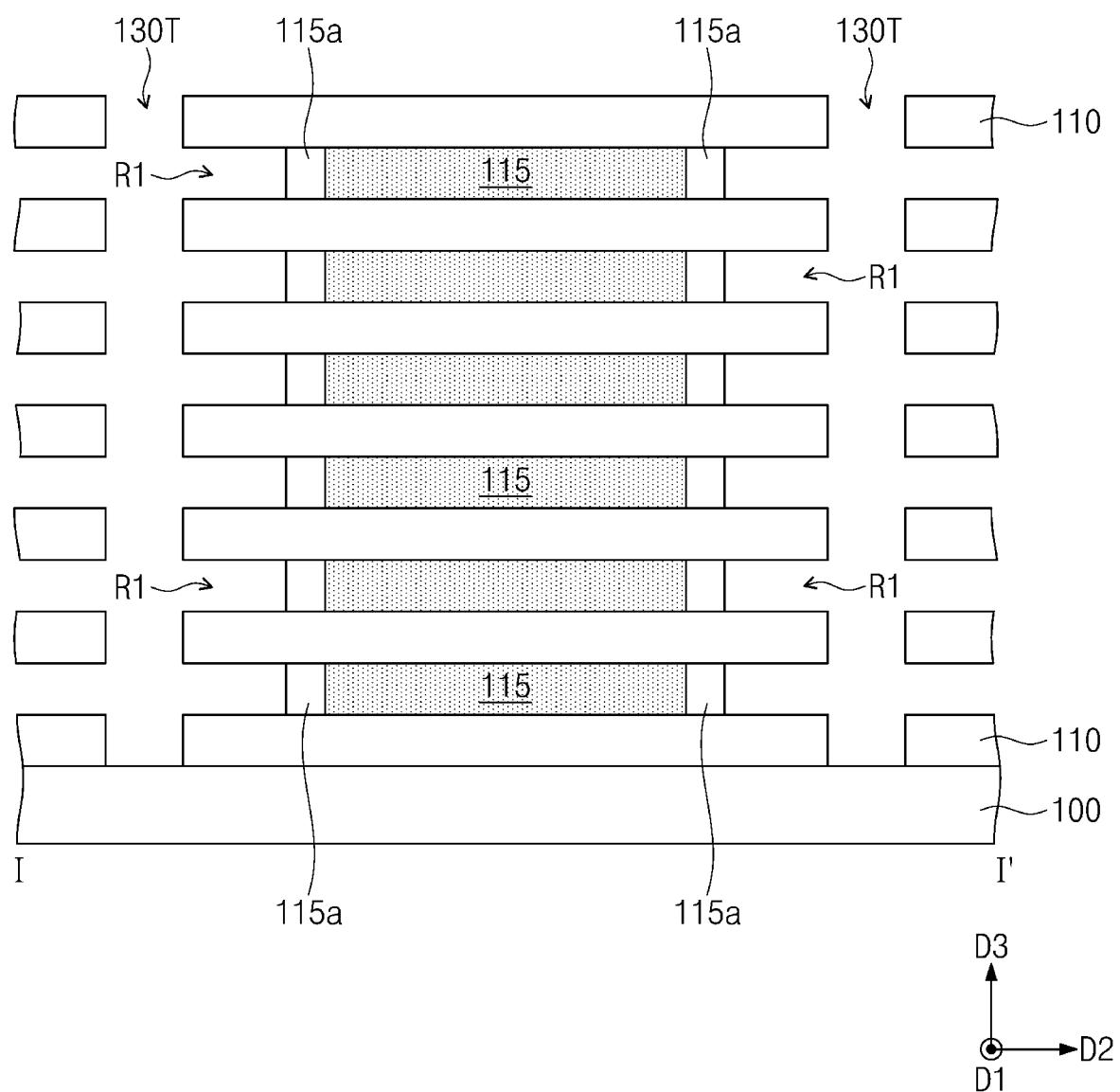
FIGS. 14 to 18 are cross-sectional views illustrating a method of manufacturing a variable resistance memory device according to some embodiments of the inventive concepts.
Figure 15:
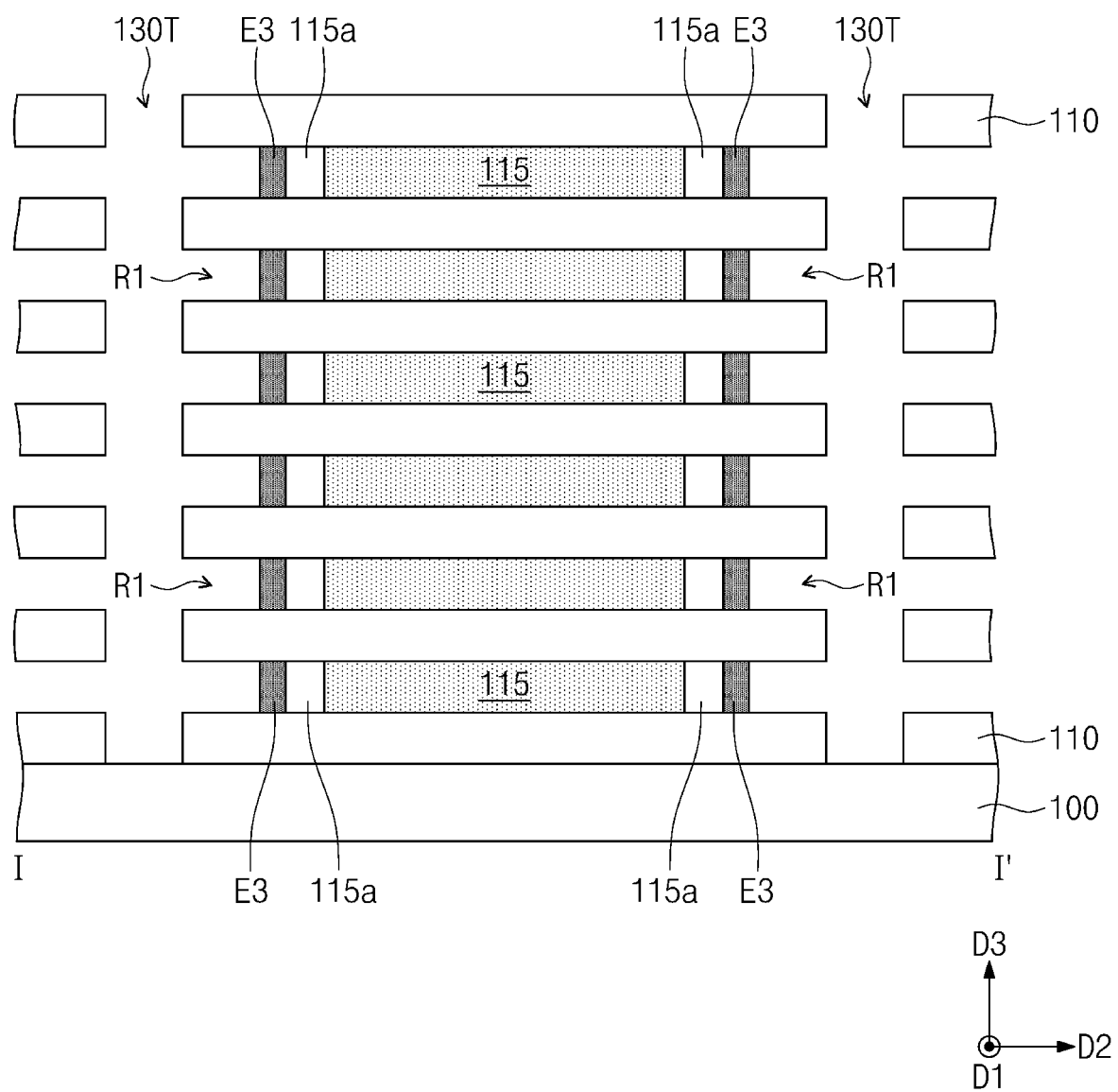
Figure 16:
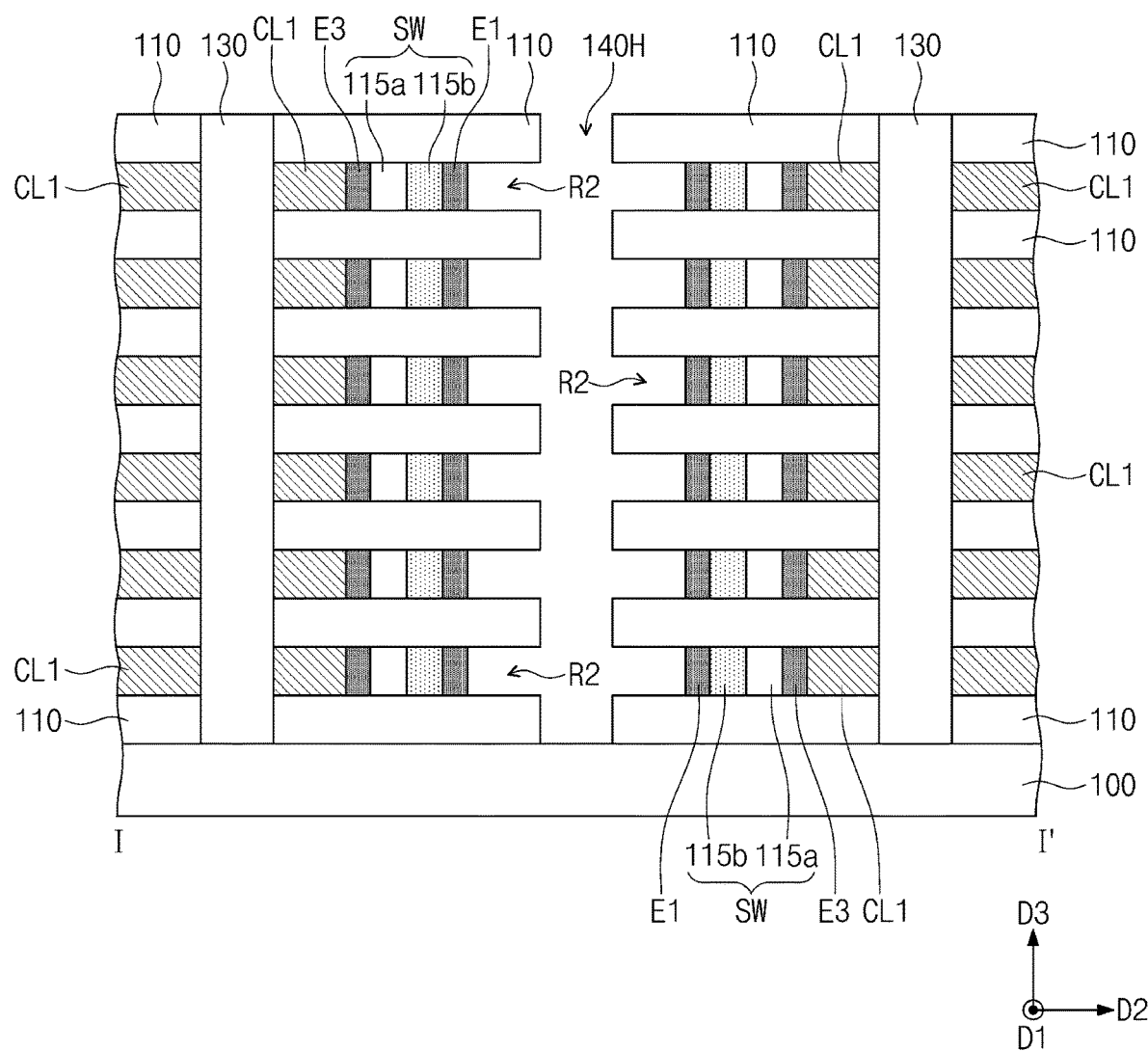
Figure 17:
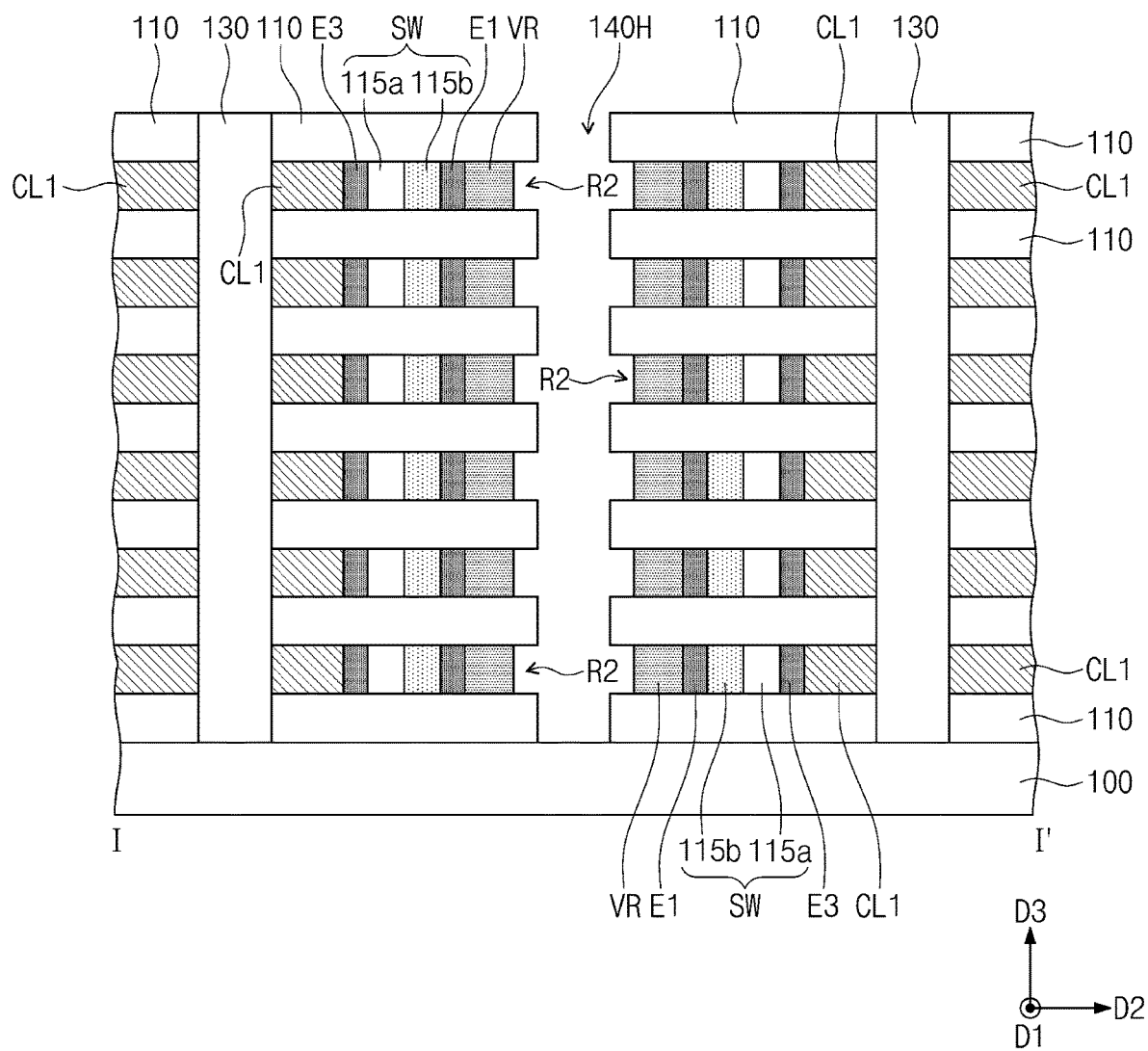
Figure 18:
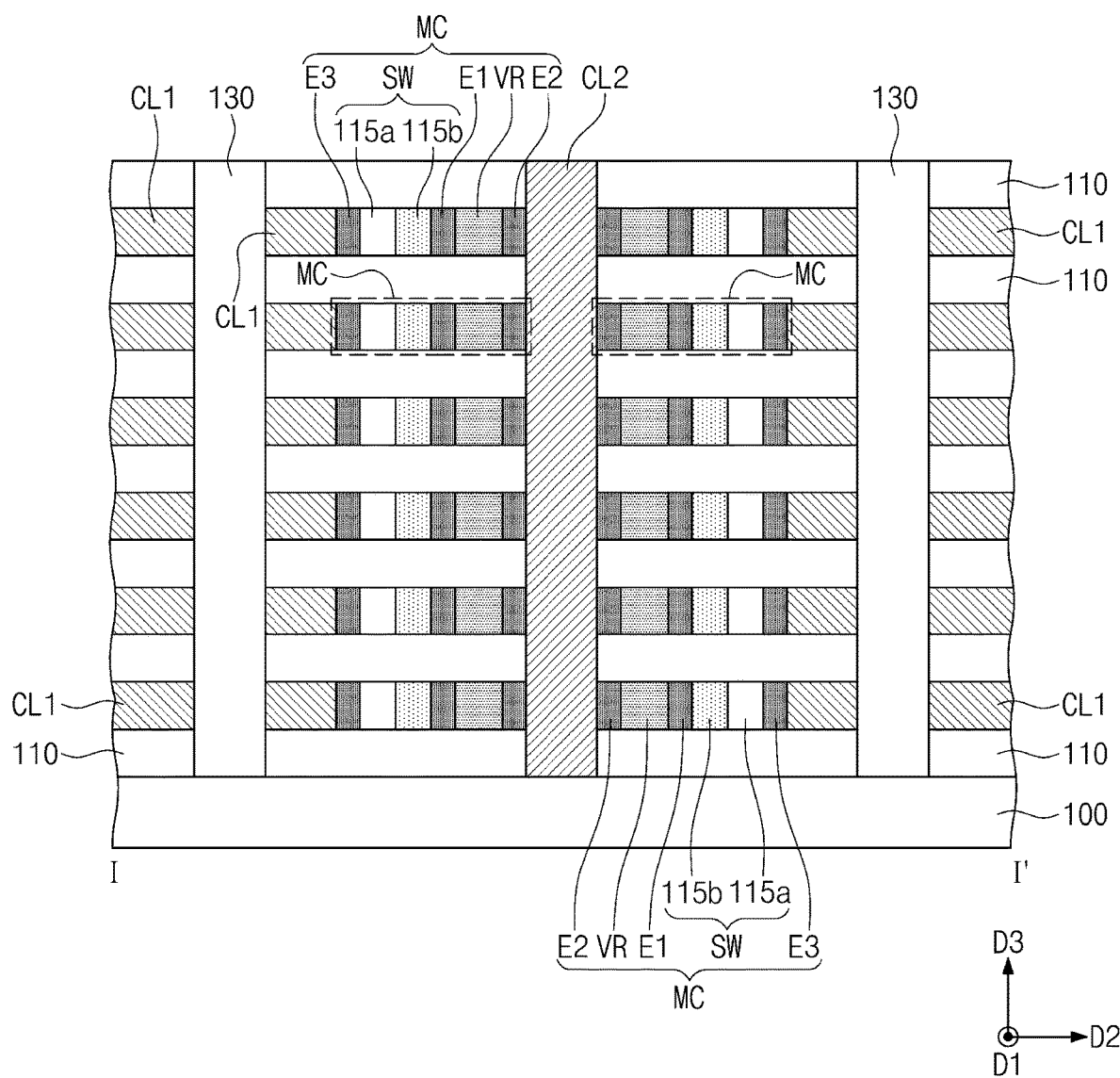

FIGS. 14 to 18 are cross-sectional views illustrating a method of manufacturing a variable resistance memory device according to some embodiments of the inventive concepts. FIGS. 14 and 15 are cross-sectional views corresponding to the line I-I' of FIG. 8A, FIGS. 16 and 17 are cross-sectional views corresponding to the line I-I' of FIG. 10A, and FIG. 18 is a cross-sectional view corresponding to the line I-I' of FIG. 11A. Hereinafter, differences between the present embodiments and the above embodiments of FIGS. 7A to 11A, 7B to 11B and 7C to 11C will be mainly described for the purpose of ease and convenience in explanation.

First, a thin-layer structure TS may be formed on a substrate 100, as described with reference to FIGS. 7A to 7C. The thin-layer structure TS may include insulating layers 110 and sacrificial layers 115, which are alternately stacked on a top surface 100u of the substrate 100. Filling insulation patterns 120 may be formed in the thin-layer structure TS.

Referring to FIGS. 8A, 8C and 14, a pair of trenches 130T may be formed to penetrate the thin-layer structure TS. The pair of trenches 130T may extend in the first direction D1 and may be spaced apart from each other in the second direction D2 with the filling insulation patterns 120 interposed therebetween. Sidewalls of the sacrificial layers 115, which are exposed by each of the trenches 130T, may be recessed to form first recess regions R1 between the insulating layers 110. The first recess regions R1 may laterally extend from each of the trenches 130T. Each of the first recess regions R1 may extend in the first direction D1 to expose sidewalls of the filling insulation patterns 120 and sidewalls of the sacrificial layers 115 between the filling insulation patterns 120. Portions of the sacrificial layers 115 exposed by the first recess regions R1 may be doped with first conductivity type dopants. Thus, a first junction pattern 115a may be formed at a side of each of the sacrificial layers 115. The sacrificial layers 115 may include second conductivity type dopants, and the first junction pattern 115a may be formed by doping a portion of each of the sacrificial layers 115 with the first conductivity type dopants.

Referring to FIGS. 8A, 8C and 15, after the formation of the first junction pattern 115a, a third electrode E3 may be formed in each of the first recess regions R1. In some embodiments, the formation of the third electrode E3 may include forming a third electrode layer filling the first recess regions R1 and at least a portion of each of the trenches 130T on the thin-layer structure TS, removing the third electrode layer from the trenches 130T, and recessing the third electrode layer until the third electrode layer of a desired thickness remains in each of the first recess regions R1. The third electrode layer may include a metal. The removal of the third electrode layer may include etching the third electrode layer until the top surface of the thin-layer structure TS and inner surfaces of the trenches 130T are exposed. Since the third electrode layer is recessed, the third electrode E3 may be locally formed in each of the first recess regions R1. Thereafter, first conductive lines CL1 may be formed in the first recess regions R1, respectively, and isolation insulating patterns 130 may be formed in the trenches 130T, respectively, as described with reference to FIGS. 9A to 9C.

Referring to FIGS. 10A, 10C and 16, according to the present embodiments, each of the first conductive lines CL1 may extend in the first direction D1 and may be in contact with sidewalls of the filling insulation patterns 120 and sidewalls of the third electrodes E3 between the filling insulation patterns 120. In some embodiments, the formation of the third electrode E3 may be omitted. In this case, each of the first conductive lines CL1 may extend in the first direction D1 so as to be in contact with the sidewalls of the filling insulation patterns 120 and sidewalls of the first junction patterns 115a between the filling insulation patterns 120.

Vertical holes 140H may be formed to penetrate the thin-layer structure TS. The vertical holes 140H and the filling insulation patterns 120 may be alternately arranged in the first direction D1 between the isolation insulating patterns 130. Each of the vertical holes 140H may expose sidewalls of the insulating layers 110 and the sacrificial layers 115 of the thin-layer structure TS and may also expose the top surface 100u of the substrate 100. The sidewalls of the sacrificial layers 115, which are exposed by each of the vertical holes 140H, may be recessed to form second recess regions R2 between the insulating layers 110. The second recess regions R2 may laterally extend from each of the vertical holes 140H. Each of the second recess regions R2 may expose a sidewall of a corresponding one of the sacrificial layers 115. A first electrode E1 may be formed at a side of the sacrificial layer 115 exposed by each of the second recess regions R2. The first electrode E1 may be formed by substantially the same method as described with reference to FIGS. 10A to 10C. A remaining portion of the sacrificial layer 115 after the formation of the first electrode E1 may be defined as a second junction pattern 115b. The first junction pattern 115a and the second junction pattern 115b may constitute a selection element SW.

Referring to FIGS. 10A, 10C and 17, a variable resistance element VR may be formed in each of the second recess regions R2. According to the present embodiments, the formation of the variable resistance element VR may include forming a variable resistance material layer filling the second recess regions R2 and at least a portion of each of the vertical holes 140H on the thin-layer structure TS, etching the variable resistance material layer until the top surface of the thin-layer structure TS and inner surfaces of the vertical holes 140H are exposed, and recessing the variable resistance material layer until the variable resistance material layer of a desired thickness remains in each of the second recess regions R2. Since the variable resistance material layer is recessed, the variable resistance element VR may be locally formed in each of the second recess regions R2. In addition, a portion of an inner surface of each of the second recess regions R2 may be exposed by recessing the variable resistance material layer.

Referring to FIGS. 11A, 11C and 18, a second electrode E2 may be formed to fill a remaining region of each of the second recess regions R2. In some embodiments, the formation of the second electrode E2 may include forming a second electrode layer filling the remaining regions of the second recess regions R2 and at least a portion of each of the vertical holes 140H on the thin-layer structure TS, and removing the second electrode layer from the vertical holes 140H. The second electrode layer may include a metal. The removal of the second electrode layer from the vertical holes 140H may include etching the second electrode layer until the top surface of the thin-layer structure TS and inner surfaces of the vertical holes 140H are exposed. Thus, the second electrode E2 may be locally formed in the remaining region of each of the second recess regions R2.

According to the present embodiments, the variable resistance element VR may be in contact with a sidewall of the second electrode E2. In some embodiments, the second electrode E2 may be omitted. In this case, the variable resistance element VR may be in contact with a sidewall of a corresponding one of second conductive lines CL2. The selection element SW, the variable resistance element VR and the first to third electrodes E1, E2 and E3 may be horizontally arranged in a direction (e.g., the second direction D2) parallel to the top surface 100u of the substrate 100. The selection element SW, the variable resistance element VR and the first to third electrodes E1, E2 and E3 may constitute a memory cell MC. Thereafter, second conductive lines CL2 may be formed in the vertical holes 140H, respectively.

Figure 19:
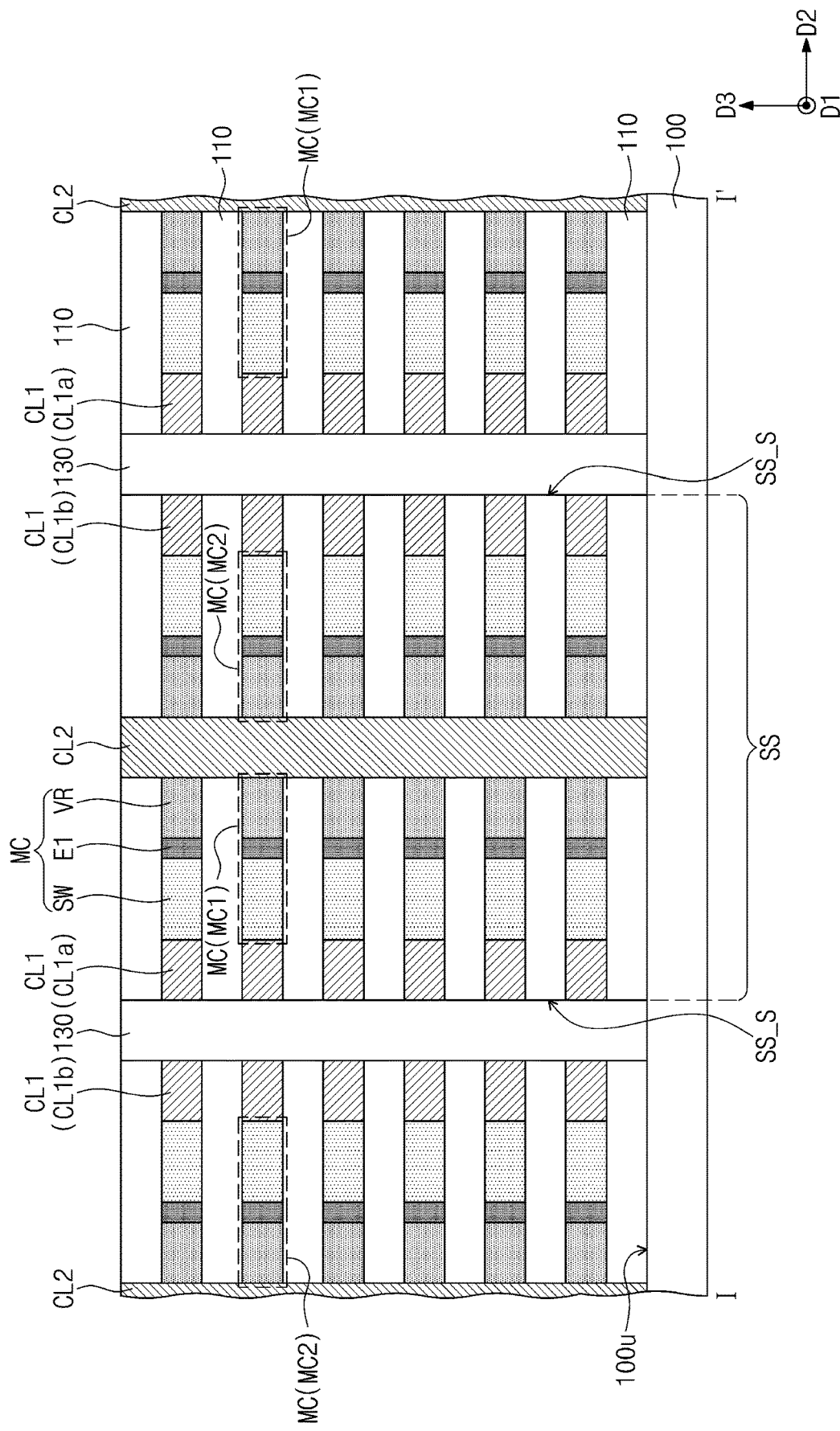
FIG. 19 is a cross-sectional view corresponding to the line I-I' of FIG. 3 to illustrate a variable resistance memory device according to some embodiments of the inventive concepts.
Figure 20:
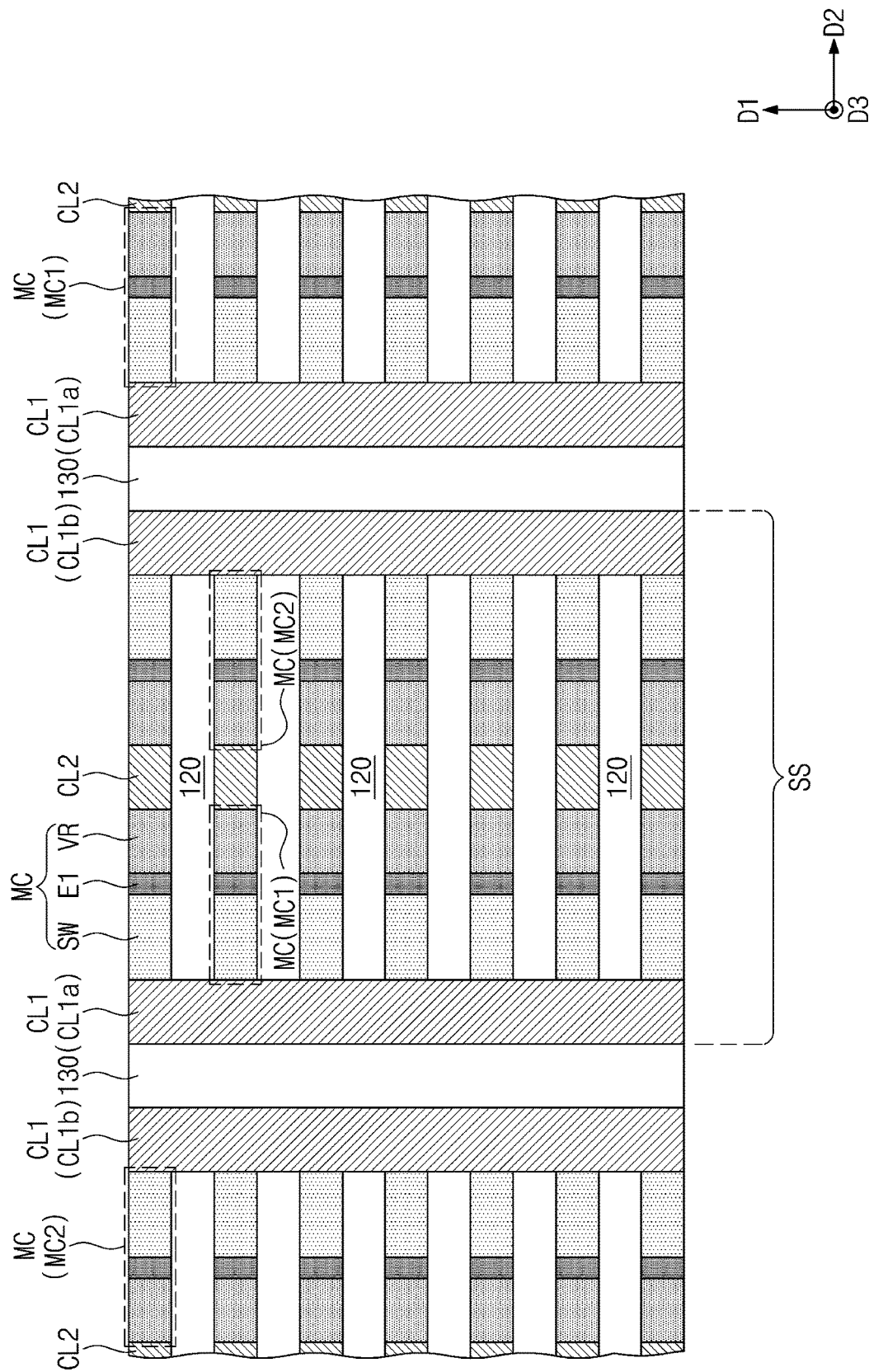
FIG. 20 is a plan view illustrating arrangement of first conductive lines, second conductive lines and memory cells of FIG. 19.

FIG. 19 is a cross-sectional view corresponding to the line I-I' of FIG. 3 to illustrate a variable resistance memory device according to some embodiments of the inventive concepts. FIG. 20 is a plan view illustrating arrangement of first conductive lines, second conductive lines and memory cells of FIG. 19. Hereinafter, differences between the present embodiments and the above embodiments of FIGS. 3 to 6 will be mainly described for the purpose of ease and convenience in explanation.

Referring to FIGS. 19 and 20, each of memory cells MC may include a variable resistance element VR, a selection element SW, and a first electrode E1 disposed therebetween. According to the present embodiments, the selection element SW may be an element based on a threshold switching phenomenon having a nonlinear I-V curve (e.g., an S-shaped I-V curve). For example, the selection element SW may be an ovonic threshold switch (OTS) element having a bi-directional characteristic. The selection element SW may have a phase change temperature between a crystalline state and an amorphous state, which is higher than that of the variable resistance element VR. Thus, when the variable resistance memory device according to the embodiments of the inventive concepts is operated, a phase of the variable resistance element VR may be reversibly changeable between a crystalline state and an amorphous state, but the selection element SW may be maintained in a substantially amorphous state without a phase change. In the present specification, the term 'substantially amorphous state' may include an amorphous state and may also include a case in which a grain boundary or a crystallized portion locally exists in a portion of a component.

The selection element SW may include a chalcogenide material. The chalcogenide material may include a compound which includes a chalcogen element (e.g., Te and/or Se) and at least one of Ge, Sb, Bi, Al, Pb, Sn, Ag, As, S, Si, In, Ti, Ga, or P. For example, the chalcogenide material may include at least one of AsTe, AsSe, GeTe, SnTe, GeSe, SnTe, SnSe, ZnTe, AsTeSe, AsTeGe, AsSeGe, AsTeGeSe, AsSeGeSi, AsTeGeSi, AsTeGeS, AsTeGeSiIn, AsTeGeSiP, AsTeGeSiSbS, AsTeGeSiSbP, AsTeGeSeSb, AsTeGeSeSi, SeTeGeSi, GeSbTeSe, GeBiTeSe, GeAsSbSe, GeAsBiTe, or GeAsBiSe. In some embodiments, the selection element SW may further include an impurity, for example, at least one of C, N, B, or O. In the present embodiments, the first electrode E1 may include a metal.

Figure 22:
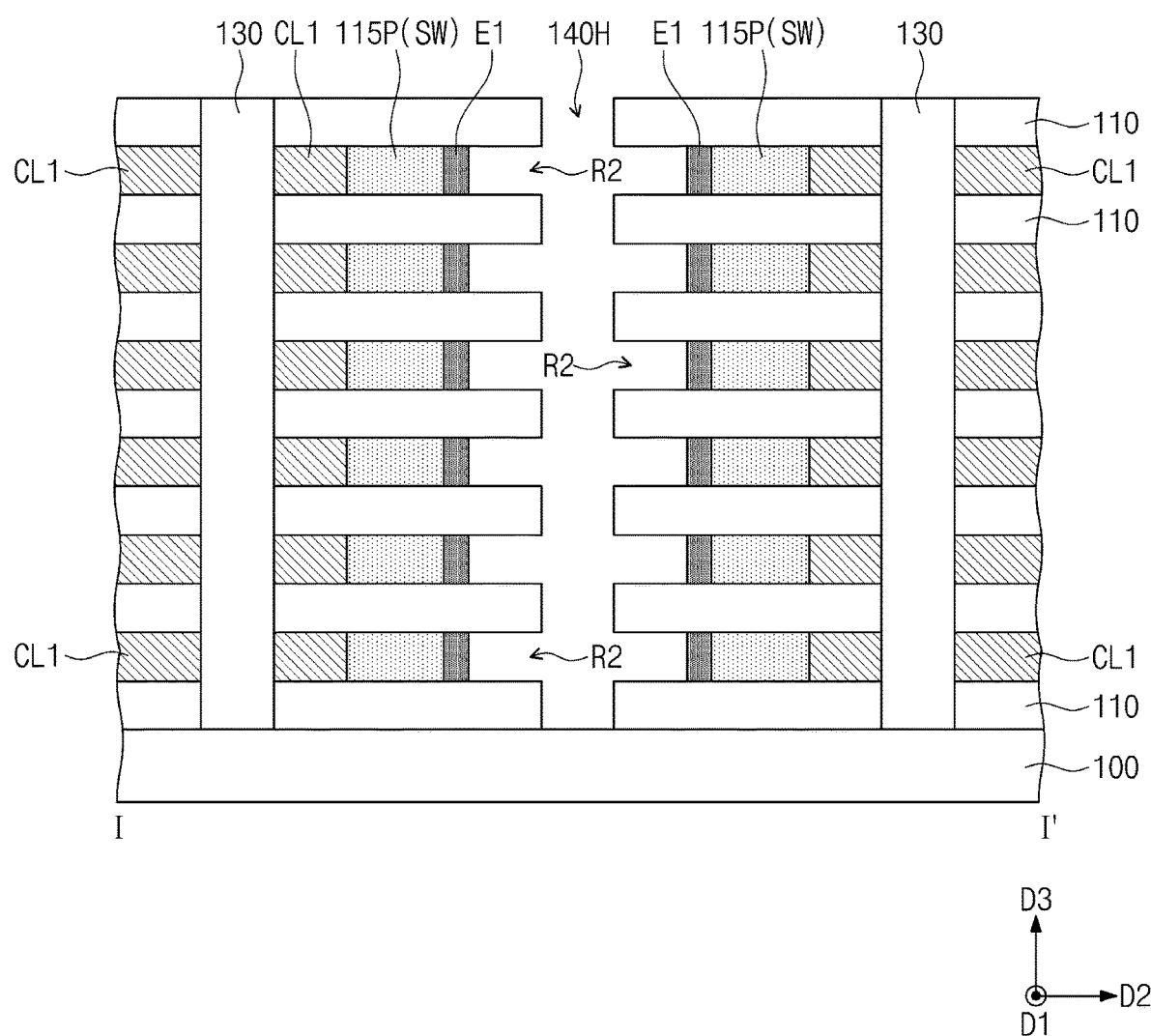

FIGS. 21 and 22 are cross-sectional views illustrating a method of manufacturing a variable resistance memory device according to some embodiments of the inventive concepts. FIGS. 21 and 22 are cross-sectional views corresponding to the line I-I' of FIG. 9A and the line I-I' of FIG. 10A, respectively. Hereinafter, differences between the present embodiments and the above embodiments of FIGS. 7A to 11A, 7B to 11B and 7C to 11C will be mainly described for the purpose of ease and convenience in explanation.

First, a thin-layer structure TS may be formed on a substrate 100, as described with reference to FIGS. 7A to 7C. The thin-layer structure TS may include insulating layers 110 and sacrificial layers 115, which are alternately stacked on a top surface 100u of the substrate 100. Filling insulation patterns 120 may be formed in the thin-layer structure TS. According to the present embodiments, the sacrificial layers 115 may include a chalcogenide material. The chalcogenide material may include a compound which includes a chalcogen element (e.g., Te and/or Se) and at least one of Ge, Sb, Bi, Al, Pb, Sn, Ag, As, S, Si, In, Ti, Ga, or P. In some embodiments, the sacrificial layers 115 may further include an impurity, for example, at least one of C, N, B, or O. Thereafter, a pair of trenches 130T may be formed to penetrate the thin-layer structure TS, as described with reference to FIGS. 8A to 8C. Sidewalls of the sacrificial layers 115, which are exposed by each of the trenches 130T, may be recessed to form first recess regions R1 between the insulating layers 110. The first recess regions R1 may laterally extend from each of the trenches 130T.

Referring to FIGS. 9A, 9C and 21, first conductive lines CL1 may be formed in the first recess regions R1, respectively, and isolation insulating patterns 130 may be formed in the trenches 130T, respectively. The first conductive lines CL1 and the isolation insulating patterns 130 may be formed by substantially the same method as described with reference to FIGS. 9A to 9C.

Referring to FIGS. 10A, 10C and 22, vertical holes 140H may be formed to penetrate the thin-layer structure TS. Each of the vertical holes 140H may expose sidewalls of the insulating layers 110 and the sacrificial layers 115 of the thin-layer structure TS and may also expose the top surface 100u of the substrate 100. The sidewalls of the sacrificial layers 115, which are exposed by each of the vertical holes 140H, may be recessed to form second recess regions R2 between the insulating layers 110. The second recess regions R2 may laterally extend from each of the vertical holes 140H. A first electrode E1 may be formed at a side of the sacrificial layer 115 exposed by each of the second recess regions R2. According to the present embodiments, the formation of the first electrode E1 may include forming a metal layer filling the second recess regions R2 and at least a portion of each of the vertical holes 140H on the thin-layer structure TS, removing the metal layer from the vertical holes 140H, and recessing the metal layer until the metal layer of a desired thickness remains in each of the second recess regions R2. A remaining portion 115P of the sacrificial layer 115 exposed by each of the second recess regions R2 may be defined as the selection element SW. Subsequent processes may be substantially the same as the processes described with reference to FIGS. 11A to 11C.

Figure 23:
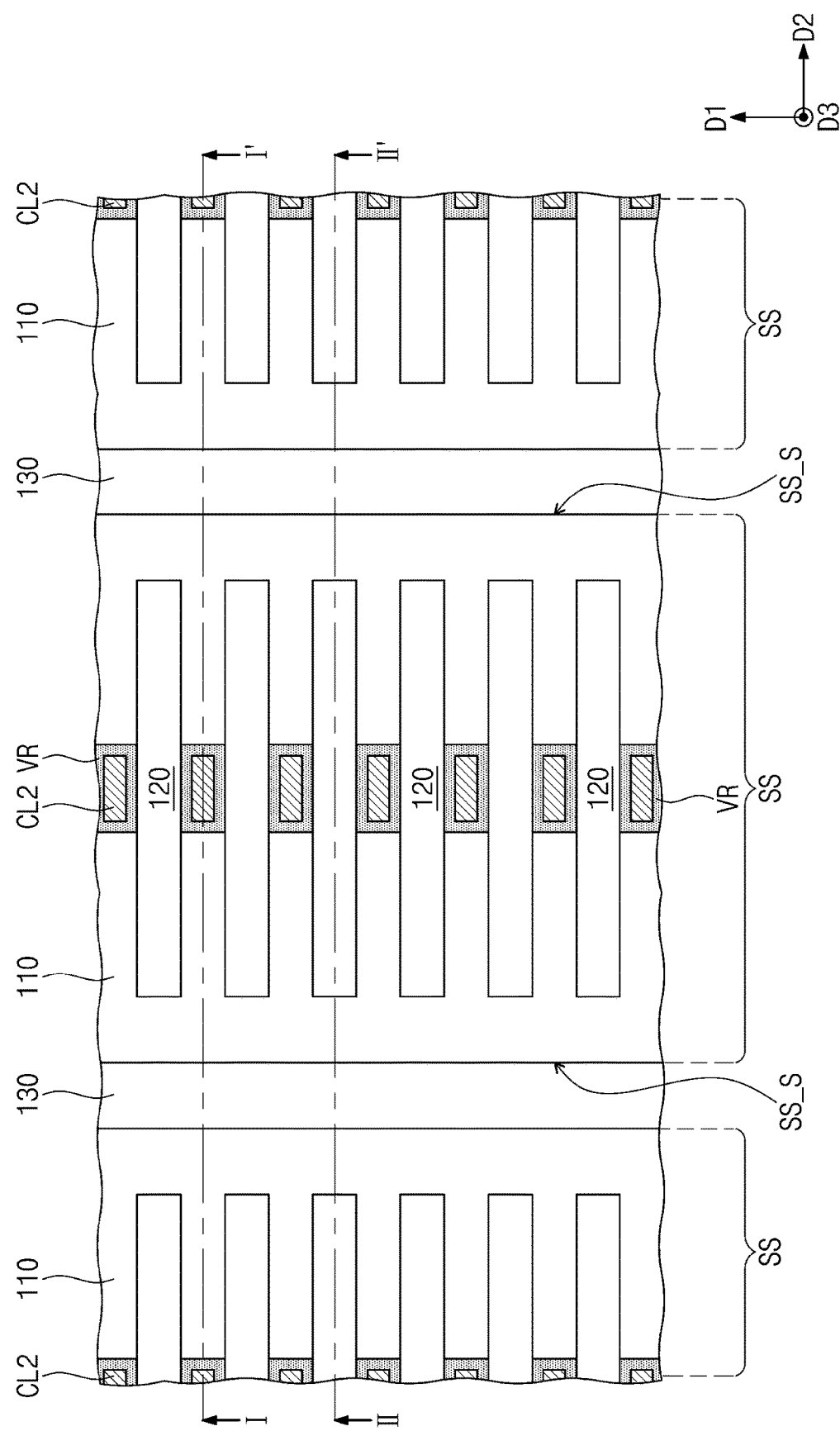
FIG. 23 is a plan view illustrating a variable resistance memory device according to some embodiments of the inventive concepts.
Figure 24:
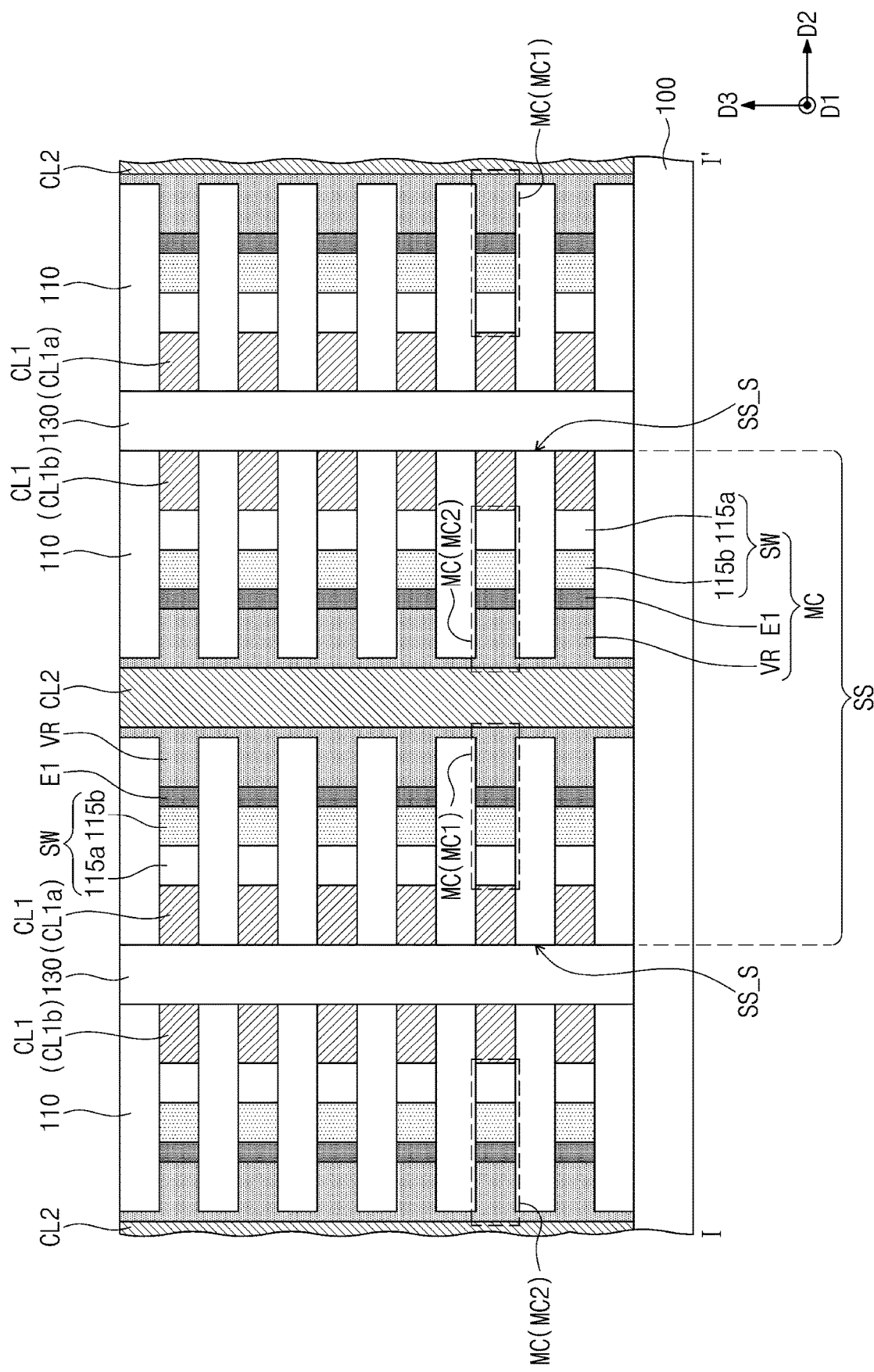
FIG. 24 is a cross-sectional view taken along a line I-I' of FIG. 23.
Figure 25:
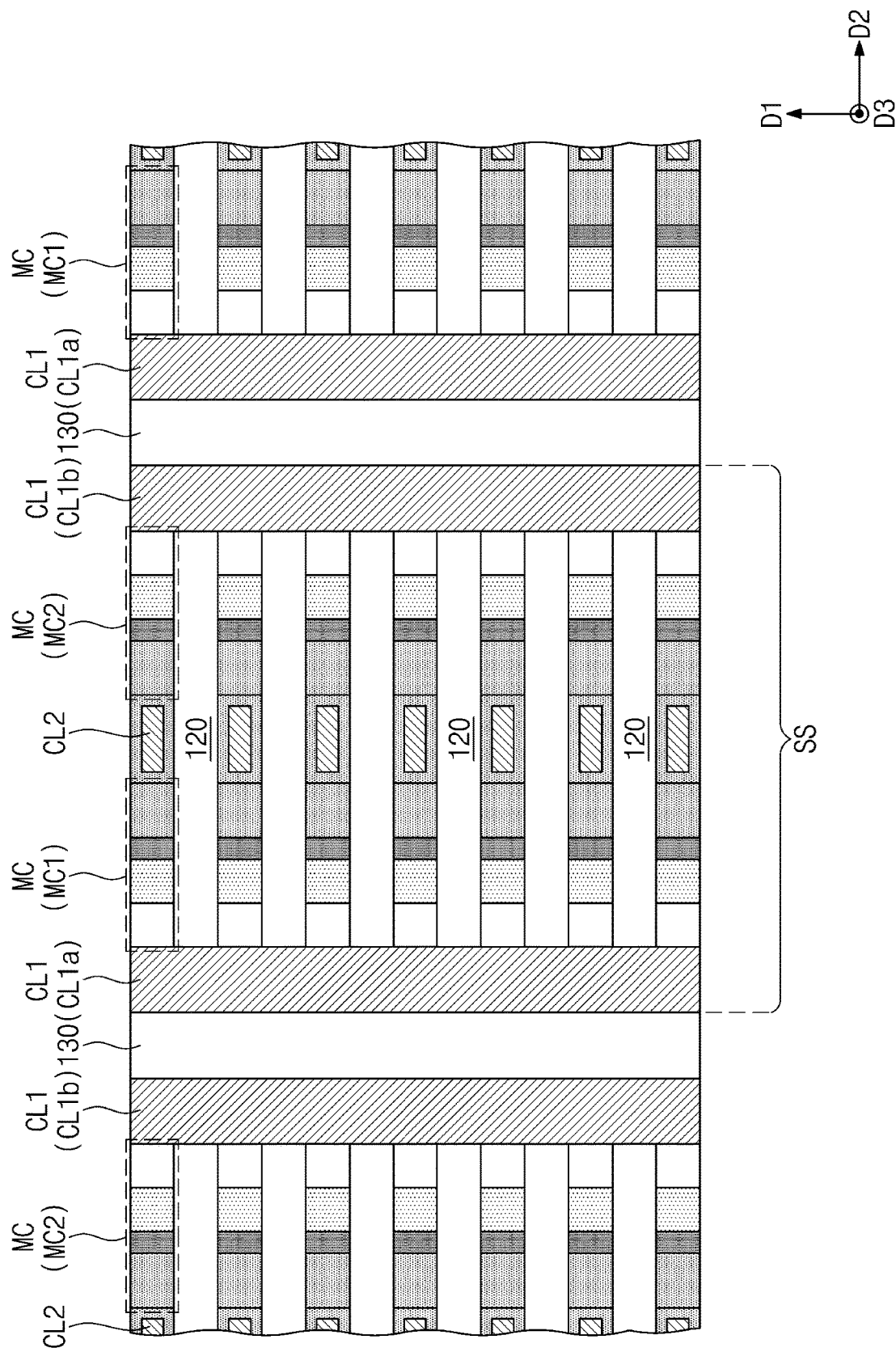
FIG. 25 is a plan view illustrating arrangement of first conductive lines, second conductive lines and memory cells of FIG. 24.

FIG. 23 is a plan view illustrating a variable resistance memory device according to some embodiments of the inventive concepts. FIG. 24 is a cross-sectional view taken along a line I-I' of FIG. 23. FIG. 25 is a plan view illustrating arrangement of first conductive lines, second conductive lines and memory cells of FIG. 24. A cross-sectional view taken along a line II-IF of FIG. 23 may be the same as FIG. 5. Hereinafter, differences between the present embodiments and the above embodiments of FIGS. 3 to 6 will be mainly described for the purpose of ease and convenience in explanation.

Referring to FIGS. 23 to 25 and 5, memory cells MC may include first memory cells MC1 provided at intersecting points of the first sub-conductive lines CL1a and the second conductive lines CL2, respectively, and second memory cells MC2 provided at intersecting points of the second sub-conductive lines CL1b and the second conductive lines CL2, respectively.

The first memory cells MC1 may be disposed between the first sub-conductive lines CL1a and the second conductive lines CL2 and may be arranged in the first direction D1 and the third direction D3. First memory cells MC1, of the first memory cells MC1, arranged in the first direction D1 may be respectively connected to the second conductive lines CL2 and may be connected in common to a corresponding one of the first sub-conductive lines CL1a. The first memory cells MC1 arranged in the first direction D1 may be spaced apart from each other and may be isolated from each other by the filling insulation patterns 120 interposed therebetween. First memory cells MC1, of the first memory cells MC1, arranged in the third direction D3 may be respectively connected to the first sub-conductive lines CL1a and may be connected in common to a corresponding one of the second conductive lines CL2. The insulating layers 110 may be disposed between the first memory cells MC1 arranged in the third direction D3.

The second memory cells MC2 may be disposed between the second sub-conductive lines CL1b and the second conductive lines CL2 and may be arranged in the first direction D1 and the third direction D3. Second memory cells MC2, of the second memory cells MC2, arranged in the first direction D1 may be respectively connected to the second conductive lines CL2 and may be connected in common to a corresponding one of the second sub-conductive lines CL1b. The second memory cells MC2 arranged in the first direction D1 may be spaced apart from each other and may be isolated from each other by the filling insulation patterns 120 interposed therebetween. Second memory cells MC2, of the second memory cells MC2, arranged in the third direction D3 may be respectively connected to the second sub-conductive lines CL1b and may be connected in common to a corresponding one of the second conductive lines CL2. The insulating layers 110 may be disposed between the second memory cells MC2 arranged in the third direction D3.

Each of the memory cells MC may include a variable resistance element VR, a selection element SW, and a first electrode E1 disposed between the variable resistance element VR and the selection element SW. Each of the memory cells MC may be locally provided between a pair of the filling insulation patterns 120 adjacent to each other in the first direction D1 and may be provided between a pair of the insulating layers 110 adjacent to each other in the third direction D3. According to the present embodiments, the variable resistance element VR of each of the memory cells MC may extend onto sidewalls of the pair of insulating layers 110 adjacent to each other in the third direction D3. Thus, the variable resistance elements VR of the memory cells MC arranged in the third direction D3 may be connected to each other. In other words, the variable resistance element VR of each of the memory cells MC may extend between a sidewall of a corresponding one of the second conductive lines CL2 and the sidewalls of the pair of insulating layers 110.

The memory cells MC may include a pair of memory cells MC spaced apart from each other in the second direction D2 with a corresponding second conductive line CL2 interposed therebetween. The pair of memory cells MC may include one of the first memory cells MC1 and one of the second memory cells MC2. The pair of memory cells MC may be connected in common to the corresponding second conductive line CL2 and may be connected to a corresponding one of the first sub-conductive lines CL1a and a corresponding one of the second sub-conductive lines CL1b, respectively. The pair of memory cells MC may be symmetrical with respect to the corresponding second conductive line CL2. For example, the variable resistance element VR of the first memory cell MC1 and the variable resistance element VR of the second memory cell MC2 may be connected in common to the corresponding second conductive line CL2. According to the present embodiments, each of the variable resistance elements VR of the first and second memory cells MC1 and MC2 may extend between a sidewall of the corresponding second conductive line CL2 and sidewalls of a pair of the insulating layers 110 adjacent to each other in the third direction D3. The variable resistance elements VR of the first and second memory cells MC1 and MC2 may surround the sidewall of the corresponding second conductive line CL2 when viewed in a plan view. Thus, the variable resistance element VR of the first memory cell MC1 may be connected to the variable resistance element VR of the second memory cell MC2.

Figure 26A:
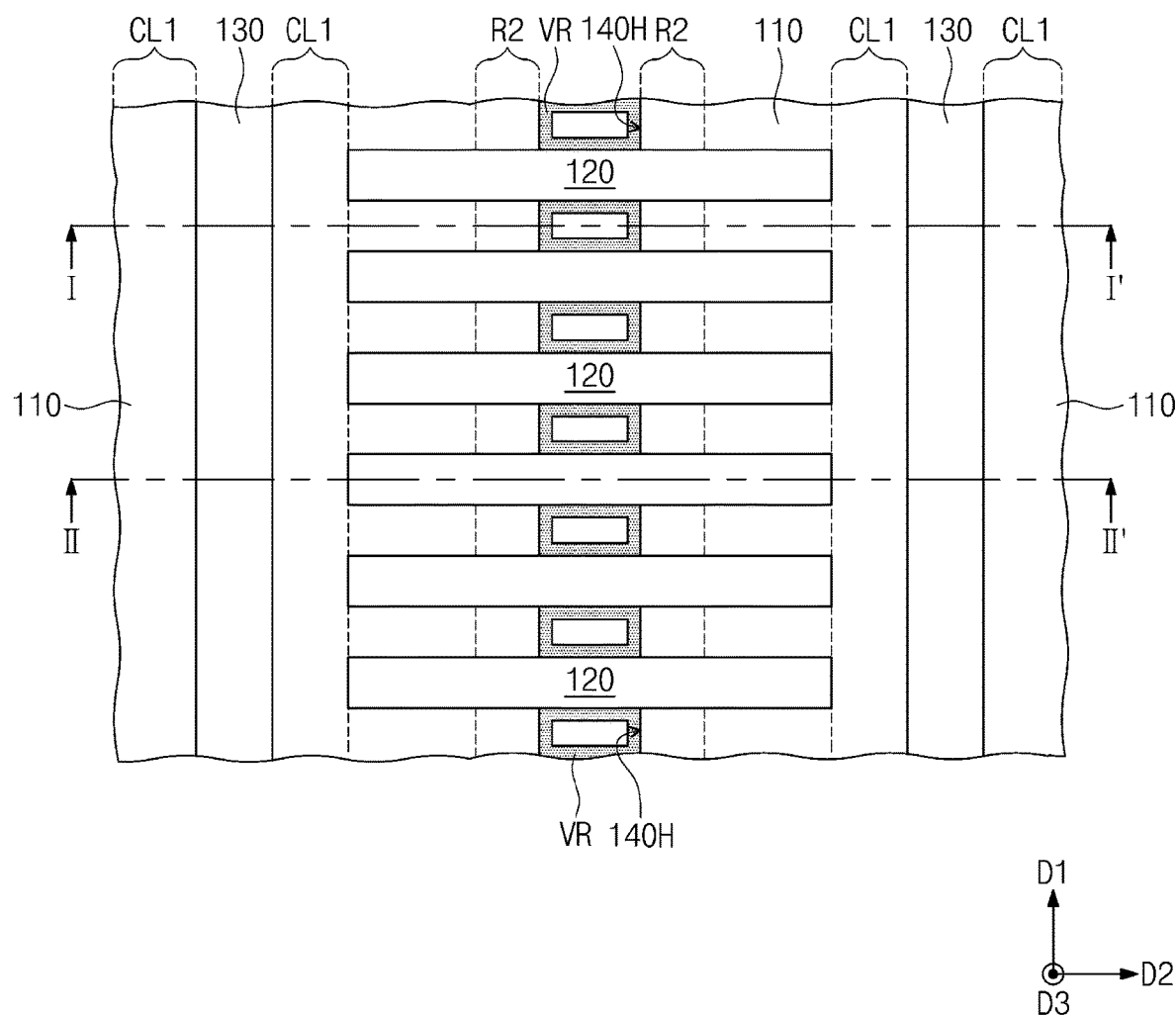
FIG. 26A is a plan view illustrating a method of manufacturing a variable resistance memory device according to some embodiments of the inventive concepts.
Figure 26B:
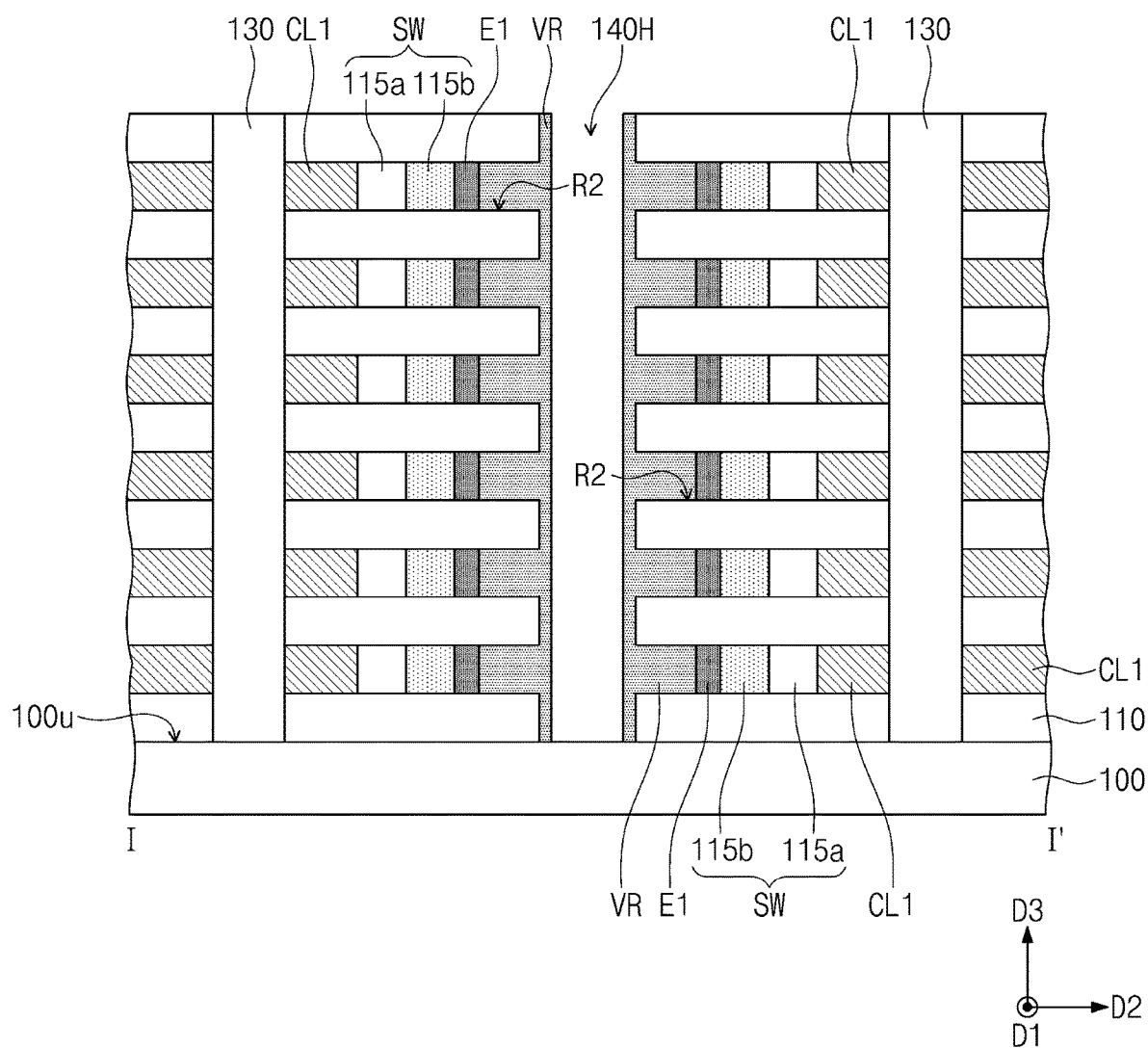
FIG. 26B is a cross-sectional view taken along a line I-I' of FIG. 26A.

FIG. 26A is a plan view illustrating a method of manufacturing a variable resistance memory device according to some embodiments of the inventive concepts, and FIG. 26B is a cross-sectional view taken along a line I-I' of FIG. 26A. A cross-sectional view taken along a line II-II' of FIG. 26A may be the same as FIG. 10C. Hereinafter, differences between the present embodiments and the above embodiments of FIGS. 7A to 11A, 7B to 11B and 7C to 11C will be mainly described for the purpose of ease and convenience in explanation.

First, a thin-layer structure TS may be formed on a substrate 100, as described with reference to FIGS. 7A to 7C. The thin-layer structure TS may include insulating layers 110 and sacrificial layers 115, which are alternately stacked on a top surface 100u of the substrate 100. Filling insulation patterns 120 may be formed in the thin-layer structure TS. A pair of trenches 130T may be formed to penetrate the thin-layer structure TS, as described with reference to FIGS. 8A to 8C. Sidewalls of the sacrificial layers 115, which are exposed by each of the trenches 130T, may be recessed to form first recess regions R1 between the insulating layers 110. Portions of the sacrificial layers 115 exposed by the first recess regions R1 may be doped with first conductivity type dopants, as described with reference to FIGS. 9A to 9C. Thus, a first junction pattern 115a may be formed at a side of each of the sacrificial layers 115. After the formation of the first junction pattern 115a, first conductive lines CL1 may be formed in the first recess regions R1, respectively, and isolation insulating patterns 130 may be formed in the trenches 130T, respectively. Vertical holes 140H may be formed to penetrate the thin-layer structure TS, as described with reference to FIGS. 10A to 10C. Sidewalls of the sacrificial layers 115, which are exposed by each of the vertical holes 140H, may be recessed to form second recess regions R2 between the insulating layers 110. A first electrode E1 may be formed at a side of the sacrificial layer 115 exposed by each of the second recess regions R2.

Referring to FIGS. 26A, 26B, and 10C, after the formation of the first electrode E1, a variable resistance element VR may be formed to fill each of the second recess regions R2. The formation of the variable resistance element VR may include forming a variable resistance material layer filling the second recess regions R2 and at least a portion of each of the vertical holes 140H on the thin-layer structure TS, and anisotropically etching the variable resistance material layer. The variable resistance material layer may be anisotropically etched to expose the top surface of the thin-layer structure TS and the top surface 100u of the substrate 100 in each of the vertical holes 140H. The anisotropically etched variable resistance material layer may fill each of the second recess regions R2 and may remain on an inner sidewall of each of the vertical holes 140H. The anisotropically etched variable resistance material layer may partially fill each of the vertical holes 140H. Thereafter, second conductive lines CL2 may be formed in the vertical holes 140H, respectively, as described with reference to FIGS. 11A to 11C. According to the present embodiments, the second conductive lines CL2 may be formed to fill remaining regions of the vertical holes 140H, respectively.

According to the embodiments of the inventive concepts, the variable resistance memory device with the increased integration density may be easily manufactured.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed:

1. A variable resistance non-volatile memory device comprising:
   a semiconductor substrate;
   a plurality of first conductive lines extending in a first direction perpendicular to the semiconductor substrate and spaced apart in a second direction on the semiconductor substrate;
   a second conductive line extending in the second direction parallel to the semiconductor substrate on a first side of the plurality of first conductive lines;
   a third conductive line extending in the second direction parallel to the semiconductor substrate on a second side of the plurality of first conductive lines opposite to the first side of the plurality of first conductive lines;
   a plurality of first non-volatile memory cells on the first side of the plurality of first conductive lines and each coupled to the second conductive line and to a respective one of the plurality of first conductive lines, wherein each of the plurality of first non-volatile memory cells includes a first variable resistance element, a first electrode, and a first switching element;
   a plurality of second non-volatile memory cells on the second side of the plurality of first conductive lines and each coupled to the third conductive line and to the respective one of the plurality of first conductive lines, wherein each of the plurality of second non-volatile memory cells includes a second variable resistance element, a second electrode, and a second switching element; and
   a plurality of filling insulation patterns between the plurality of first conductive lines, the plurality of filling insulation patterns extending in the first direction,
   wherein the plurality of first conductive lines and the plurality of filling insulation patterns are alternatively arranged in the second direction, and the plurality of filling insulation patterns extend between the plurality of first non-volatile memory cells and between the plurality of second non-volatile memory cells in a third direction that is parallel to the semiconductor substrate and cross the second direction.

2. The variable resistance non-volatile memory device of claim 1, wherein each first conductive line comprises a bit line, the second conductive line comprises a word line, and the third conductive line comprises another word line,
   wherein each of the plurality of first non-volatile memory cells includes the first variable resistance element connected to the respective one of the plurality of first conductive lines and followed by the first electrode followed by the first switching element, and
   wherein each of the plurality of second non-volatile memory cells includes the second variable resistance element connected to the respective one of the plurality of first conductive lines and followed by the second electrode followed by the second switching element.

3. The variable resistance non-volatile memory device of claim 2, wherein each of the plurality of first non-volatile memory cells further includes another electrode between the first variable resistance element and the respective one of the plurality of first conductive lines.

4. The variable resistance non-volatile memory device of claim 3, wherein each of the plurality of first non-volatile memory cells further includes yet another electrode between the first switching element and the second conductive line.

5. The variable resistance non-volatile memory device of claim 2, wherein each of the plurality of first non-volatile memory cells further includes another electrode between the first switching element and the second conductive line.

6. The variable resistance non-volatile memory device of claim 1, wherein the first switching, element comprises a first junction pattern and a second junction pattern which have different conductivity types from each other.

7. The variable resistance non-volatile memory device of claim 1, wherein the first variable switching element comprises a diode.

8. The variable resistance non-volatile memory device of claim 1, wherein the first variable resistance element comprises a phase change material of which a phase is changeable between a crystalline state and an amorphous state according to temperature.

9. The variable resistance non-volatile memory device of claim 1, wherein the variable resistance non-volatile memory further comprises another second conductive line, another third conductive line, another plurality of first non-volatile memory cells and another plurality of second non-volatile memory cells formed below and having the same structures as the second conductive line, the third conductive line, the plurality of first non-volatile memory cells and the plurality of second non-volatile memory cells, respectively, and wherein the first variable resistance element of each of the plurality of first non-volatile memory cells is connected to the first variable resistance element of each of the other plurality of first non-volatile memory cells and the second variable resistance element of each of the plurality of second non-volatile memory cells.

10. The variable resistance non-volatile memory of claim 1 further comprising, on the semiconductor substrate, another plurality of first conductive lines, another second conductive line, another third conductive line, another plurality of first non-volatile memory cells, and another plurality of second non-volatile memory cells having the same structure as the plurality of first conductive lines, the second conductive line, the third conductive line, the plurality of first non-volatile memory cells, and the plurality of second non-volatile memory cells, wherein the other second conductive line is formed at a same level as the third conductive line on the semiconductor substrate and separated by an insulating structure.

11. A variable resistance non-volatile memory device comprising:
a semiconductor substrate;
a first conductive line comprising a bit line and extending in a first direction perpendicular to the semiconductor substrate;
at least three second conductive lines formed vertically stacked on one another, each comprising a word line and extending in a second direction parallel to the semiconductor substrate on a first side of the first conductive line;
at least three third conductive lines formed vertically stacked on one another, each comprising another word line and extending in the second direction parallel to the semiconductor substrate on a second side of the first conductive line opposite to the first side of the first conductive line;
a plurality of insulating layers each of which separates two vertically adjacent ones of the at least three second conductive lines from one another and separates two vertically adjacent ones of the at least three third conductive lines from one another;
at least three first non-volatile memory cells formed stacked on one another on the first side of the first conductive line, and coupled to the at least three second conductive lines and separated from one another by ones of the plurality of insulating layers; and
at least three second non-volatile memory cells formed stacked on one another on the second side of the first conductive line and coupled to the at least three third conductive lines and separated from one another by the ones of the plurality of insulating layers, wherein each of the last three first non-volatile memory cells includes a first variable resistance element connected to the first conductive line and followed by a first electrode followed by a first switching element, and each of the at least three second non-volatile memory cells includes a second variable resistance element connected to the first conductive line and followed by a second electrode followed by a second switching element.

12. The variable resistance non-volatile memory device of claim 11, wherein the first variable resistance element included on one of the at least three first non-volatile memory cells and the first variable resistance element included in another of the at least three first non-volatile memory cells are connected to the first conductive line and separated from each other by one of the plurality of insulating layers.

13. The variable resistance non-volatile memory device of claim 12,
wherein the first variable resistance element comprises a phase change material of which a phase is changeable between a crystalline state and an amorphous state according to temperature.

14. The variable resistance non-volatile memory device of claim 13, wherein the phase change material comprises a chalcogen element and at least one of Ge, Sb, Bi, PB, Sn, Ag, As, S, Si, In, Ti, Ga, P, O and C.

15. The variable resistance non-volatile memory device of claim 11, wherein each of the at least three first non-volatile memory cells further includes another electrode between the first variable resistance element and the first conductive line.

16. The variable resistance non-volatile memory device of claim 15, wherein each of the at least three first non-volatile memory cells further includes yet another electrode between the first switching element and respective one of the at least three second conductive lines.

17. The variable resistance non-volatile memory device of claim 11, wherein each of the at least three first non-volatile memory cells further includes another electrode between the first switching element and a respective one of the at least three second conductive lines.

18. The variable resistance non-volatile memory device of claim 11, wherein the first switching element comprises a first junction pattern and a second junction pattern which have different conductivity types from each other.

19. The variable resistance non-volatile memory device of claim 11, wherein the first switching element comprises a diode.

20. The variable resistance non-volatile memory of claim 11, wherein the first variable resistance elements of the at least three first non-volatile memory cells are connected to one another, and further connected to the second variable resistance elements of the at least three second non-volatile memory cells, respectively.

21. The variable resistance non-volatile memory of claim 11 further comprising, on the semiconductor substrate, another first conductive line, another at least three second conductive lines, another at least three third conductive lines, another plurality of insulating layers, another at least three first non-volatile memory cells, and another at least three second non-volatile memory cells having the same structure as the first conductive line, the at least three second conductive lines, the at least three third conductive lines, the plurality of insulating layers, the at least three first non-volatile memory cells, and the at least three second non-volatile memory cells, wherein the other at least three second conductive lines are formed at a same level as the three third conductive lines on the semiconductor substrate and separated by an insulating structure.

22. A variable resistance non-volatile memory device comprising:

a semiconductor substrate;

a first conductive line comprising a bit line and extending in a first direction perpendicular to the semiconductor substrate;

a plurality of second conductive lines vertically stacked on one another, each comprising a word line and extending in a second direction parallel to the semiconductor substrate on a first side of the first conductive line;

a plurality of third conductive lines vertically stacked on one another, each comprising another word line and extending in the second direction parallel to the semiconductor substrate on a second side of the first conductive line opposite to the first side of the first conductive line;

a plurality of insulating layers each of which separates vertically adjacent ones of the plurality of second conductive lines from one another and separates vertically adjacent ones of the plurality of third conductive lines from one another; and a plurality of variable resistance elements formed between the plurality of insulating layers to be coupled to respective ones of the plurality of second conductive lines and to respective ones of the plurality of third conductive lines, wherein the plurality of variable resistance elements includes a plurality of first variable resistance elements on the first side of the first conductive line, each coupled to a respective one of the plurality of second conductive lines and to the first conductive line, and including a first variable resistance element connected to the first conductive line and followed by a first electrode followed by a first switching element, and wherein the plurality of variable resistance elements further include a plurality of second variable resistance elements on the second side of the first conductive line, each coupled to a respective one of the plurality of third conductive lines and to the first conductive line, and including a second variable resistance element connected to the first conductive line and followed by a second electrode followed by a second switching element.

23. The variable resistance non-volatile memory device of claim 22, wherein the first variable resistance element included in one of a plurality of first non-volatile memory cells and the first variable resistance element included in another one of a plurality of first non-volatile memory cells are connected to the first conductive line and separated from each other by one of the plurality of insulating layers.

24. The variable resistance non-volatile memory device of claim 23, wherein the first volatile variable resistance element comprises a phase change material of which a phase is changeable between a crystalline state and an amorphous state according to temperature.

25. The variable resistance non-volatile memory device of claim 24, wherein the phase change material comprises a chalcogen element and at least one of Ge, Sb, Bi, PB, Sn, Ag, As, S, Si, In, Ti, Ga, P, O and C.

26. The variable resistance non-volatile memory device of claim 23, wherein the first switching element comprises a diode.

27. The variable resistance non-volatile memory device of claim 22, wherein each of the plurality of first variable resistance elements further includes another electrode between the first variable resistance element and the first conductive line.

28. The variable resistance non-volatile memory device of claim 27, wherein each of the plurality of first variable resistance elements further includes yet another electrode between the first switching element and a respective one of the plurality of second conductive lines.

29. The variable resistance non-volatile memory device of claim 22, wherein each of the plurality of first variable resistance elements further includes another electrode between the first switching element and a respective one of the plurality of second conductive lines.

30. The variable resistance non-volatile memory device of claim 22, wherein the first switching element comprises a first junction pattern and second junction pattern which have different conductivity types from each other.

31. The variable resistance non-volatile memory of claim 22, wherein the first variable resistance elements of a plurality of first non-volatile memory cells are connected to one another, and further connected to the second variable resistance elements of a plurality of second non-volatile memory cells, respectively.

32. The variable resistance non-volatile memory of claim 22 further comprising, on the semiconductor substrate, another first conductive line, another plurality of second conductive lines, another plurality of third conductive lines, another plurality of insulating layers, another plurality of first non-volatile memory cells, and another plurality of second non-volatile memory cells having the same structure as the first conductive line, the plurality of second conductive lines, the plurality of third conductive lines, the plurality of insulating layers, the plurality of first non-volatile memory cells, and the plurality of second non-volatile memory cells, wherein the other plurality of second conductive lines are formed at a same level as the plurality of third conductive lines on the semiconductor substrate and separated by an insulating structure.

* * * * *